(12) United States Patent
Lim

(10) Patent No.: US 9,171,670 B2
(45) Date of Patent: Oct. 27, 2015

(54) CAPACITOR STRUCTURES HAVING SUPPORTING PATTERNS AND METHODS OF FORMING THE SAME

(71) Applicant: SAMSUNG ELECTRONICS CO., LTD., Suwon-si, Gyeonggi-do (KR)

(72) Inventor: Jun-Hee Lim, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 123 days.

(21) Appl. No.: 13/761,294

(22) Filed: Feb. 7, 2013

(65) Prior Publication Data

US 2013/0250477 A1 Sep. 26, 2013

(30) Foreign Application Priority Data

Mar. 23, 2012 (KR) ........................ 10-2012-0029995

(51) Int. Cl.
| | |
|---|---|
| H01G 7/00 | (2006.01) |
| H01G 4/018 | (2006.01) |
| H01G 4/01 | (2006.01) |
| H01G 4/33 | (2006.01) |
| H01G 4/38 | (2006.01) |
| H01G 4/08 | (2006.01) |
| H01L 27/108 | (2006.01) |
| H01L 49/02 | (2006.01) |

(52) U.S. Cl.
CPC ............... *H01G 4/018* (2013.01); *H01G 4/01* (2013.01); *H01G 4/085* (2013.01); *H01G 4/33* (2013.01); *H01G 4/38* (2013.01); *H01L 27/10852* (2013.01); *H01L 28/91* (2013.01); *Y10T 29/435* (2015.01)

(58) Field of Classification Search
CPC ..................... H01L 21/0337; H01L 21/31144
USPC .................. 29/25.35–25.42, 25.03, 833–831, 29/846–847; 361/303–305, 321.1–321.2, 361/306.1–306.3; 438/253, 398; 257/296, 257/308, 532
See application file for complete search history.

(56) References Cited

U.S. PATENT DOCUMENTS

| | | | | |
|---|---|---|---|---|
| 6,448,146 | B1* | 9/2002 | Lee et al. | 438/398 |
| 7,495,311 | B2* | 2/2009 | Kim et al. | 257/532 |
| 7,691,719 | B2* | 4/2010 | Yun et al. | 438/396 |
| 7,910,452 | B2 | 3/2011 | Roh et al. | |
| 8,704,283 | B2* | 4/2014 | Kim et al. | 257/296 |
| 8,728,887 | B2* | 5/2014 | Lee et al. | 438/250 |
| 8,927,384 | B2* | 1/2015 | Kim et al. | 438/381 |

(Continued)

FOREIGN PATENT DOCUMENTS

| | | |
|---|---|---|
| JP | 2010-287854 A | 12/2010 |
| KR | 10-2008-0084391 A | 9/2008 |

(Continued)

*Primary Examiner* — Minh Trinh
(74) *Attorney, Agent, or Firm* — Lee & Morse, P.C.

(57) ABSTRACT

A method of forming a capacitor structure includes forming a mold layer on a substrate, in which the substrate includes a plurality of plugs therein, partially removing the mold layer to form a plurality of openings, in which the plugs are exposed by the openings, forming a plurality of lower electrodes filling the openings, in which the lower electrodes have a pillar shape, removing an upper portion of the mold layer to expose upper portions of the lower electrodes, forming a supporting pattern on exposed upper sidewalls of the lower electrodes and on the mold layer, removing the mold layer, and sequentially forming a dielectric layer and an upper electrode on the lower electrodes and the supporting pattern.

17 Claims, 24 Drawing Sheets

(56) References Cited

U.S. PATENT DOCUMENTS

| | | | |
|---|---|---|---|
| 2003/0153146 A1* | 8/2003 | Won et al. ............... | 438/253 |
| 2007/0045703 A1* | 3/2007 | Choi ........................ | 257/308 |
| 2008/0186648 A1 | 8/2008 | Choi et al. | |
| 2009/0004808 A1 | 1/2009 | Lee et al. | |
| 2009/0209080 A1 | 8/2009 | Sandhu et al. | |
| 2010/0012989 A1 | 1/2010 | Lee et al. | |
| 2010/0237466 A1* | 9/2010 | Kim et al. ............... | 257/532 |

FOREIGN PATENT DOCUMENTS

| | | |
|---|---|---|
| KR | 10-2009-0000519 A | 1/2009 |
| KR | 10-2009-0016810 A | 2/2009 |
| KR | 10-2009-0016839 A | 2/2009 |
| KR | 10-2009-0068774 A | 6/2009 |
| KR | 10-2009-0068775 A | 6/2009 |
| KR | 10-2009-0099775 A | 9/2009 |
| KR | 10-2010-0119445 A | 11/2010 |

* cited by examiner

SECOND DIRECTION
⊗ → FIRST DIRECTION

SECOND DIRECTION
↑
→ FIRST DIRECTION

SECOND DIRECTION
FIRST DIRECTION

SECOND DIRECTION
FIRST DIRECTION

SECOND DIRECTION

FIRST DIRECTION

SECOND DIRECTION

FIRST DIRECTION

SECOND DIRECTION
⊗⟶
FIRST DIRECTION

SECOND DIRECTION
⊗ → FIRST DIRECTION

SECOND DIRECTION
↓
FIRST DIRECTION

FIRST DIRECTION
⊗ → SECOND DIRECTION

FIRST DIRECTION
⊗ → SECOND DIRECTION

FIRST DIRECTION
SECOND DIRECTION

SECOND DIRECTION
FIRST DIRECTION

FIRST DIRECTION
SECOND DIRECTION

SECOND DIRECTION
FIRST DIRECTION

CAPACITOR STRUCTURES HAVING SUPPORTING PATTERNS AND METHODS OF FORMING THE SAME

CROSS-REFERENCE TO RELATED APPLICATION

This application claims priority under 35 USC §119 to Korean Patent Application No. 10-2012-0029995, filed on Mar. 23, 2012 in the Korean Intellectual Property Office (KIPO), the contents of which are herein incorporated by reference in their entirety.

BACKGROUND

As semiconductor devices become highly integrated, aspect ratios of capacitors included in the semiconductor devices may become drastically increased.

SUMMARY

Embodiments may be realized by providing a method of forming a capacitor structure that includes forming a mold layer on a substrate, in which the substrate includes a plurality of plugs therein, partially removing the mold layer to form a plurality of openings, in which the plugs are exposed by the openings, forming a plurality of lower electrodes filling the openings, in which the lower electrodes have a pillar shape, removing an upper portion of the mold layer to expose upper portions of the lower electrodes, forming a supporting pattern on exposed upper sidewalls of the lower electrodes and on the mold layer, removing the mold layer, and sequentially forming a dielectric layer and an upper electrode on the lower electrodes and the supporting pattern.

The mold layer may be formed with silicon oxide and the supporting pattern may be formed with silicon nitride. Removing the upper portion of the mold layer may include performing an etch-back process.

Forming the supporting pattern may include forming a supporting layer on the mold layer and to cover the exposed upper sidewalls of the lower electrodes, and anisotropically etching the supporting layer. A thickness of the supporting pattern may increase from a top portion of the supporting pattern to a bottom portion of the supporting pattern.

Ones of the plurality of lower electrodes may be arranged in a first direction to form one lower electrode row, and a plurality of lower electrode rows may be arranged in a second direction perpendicular to the first direction. The ones of the plurality of lower electrodes in the one lower electrode row may be connected to each other by the supporting pattern.

Another of the plurality of lower electrodes rows, which is adjacent to the one lower electrode row, may include others of the plurality of lower electrodes. The ones of the plurality of lower electrodes and the others of the plurality of lower electrodes may be connected to each other by the supporting pattern.

The plurality of lower electrodes may include first lower electrodes and second lower electrodes. The second lower electrodes of the one lower electrode row may be at opposite ends of the one lower electrode row, and the first lower electrodes of the one lower electrode row may be between the second lower electrodes of the one lower electrode row. A width or a diameter of the second lower electrodes of the one lower electrode row may be larger than that of the first lower electrodes of the one lower electrode row.

The second lower electrodes in the one lower electrode row and second lower electrodes in an adjacent one of the plurality of lower electrode rows in the second direction may be connected to each other by the supporting pattern. The first lower electrodes in the one lower electrode row and first lower electrodes in the adjacent one of the plurality of lower electrode rows in the second direction may not be connected to each other by the supporting pattern.

The method may include forming a mask partially covering the mold layer and the plurality of lower electrode rows, after forming the plurality of the lower electrodes. The mask may cover a part of the lower electrodes in the plurality of lower electrode rows such that the exposed upper sidewalls of the lower electrodes on which the supporting pattern is formed are exposed by the mask. The lower electrodes included in two adjacent lower electrode rows of the plurality of lower electrode rows may be connected to each other by the supporting pattern to form a rectangular array.

Embodiments may also be realized by providing a capacitor structure that includes a plurality of lower electrodes in contact with plugs in a substrate, in which the lower electrodes have a pillar shape, a supporting pattern on upper sidewalls of the lower electrodes, in which a thickness of the supporting pattern increasing from a top portion to a bottom portion thereof, a dielectric layer on the lower electrodes and the supporting pattern, and an upper electrode on the dielectric layer.

Ones of the plurality of lower electrodes may be arranged in a first direction to form one lower electrode row. A plurality of lower electrode rows may be arranged in a second direction perpendicular to the first direction. The ones of the plurality of lower electrodes in the one lower electrode row may be connected to each other by the supporting pattern.

The plurality of lower electrodes may include first lower electrodes and second lower electrodes. The second lower electrodes in the one lower electrode row may be at opposite ends of the one lower electrode row, and the first lower electrodes of the one lower electrode row may be between the second lower electrodes of the one lower electrode row. A width or a diameter of the second lower electrodes of the one lower electrode row may be larger than that of the first lower electrodes of the one lower electrode row. The second lower electrodes of the one lower electrode row and second lower electrodes in an adjacent one of the plurality of lower electrode rows in the second direction may be connected to each other by the supporting pattern. The first lower electrodes of the one lower electrode row and first lower electrodes in the adjacent one of the plurality of lower electrode rows in the second direction may not be connected to each other by the supporting pattern.

Embodiments may also be realized by providing a method of forming a capacitor structure that includes forming openings in a mold layer on a substrate, in which the openings expose plugs in the substrate, forming a plurality of lower electrodes to fill the openings in the mold layer, removing an upper portion of the mold layer such that a lower portion of the mold layer remains on the substrate, forming a supporting pattern on the lower portion of the mold layer, removing the lower portion of the mold layer to form voids under the supporting pattern, forming a dielectric layer and an upper electrode in the voids.

The supporting pattern may be formed as a continuous layer that encloses at least two of the plurality of lower electrodes. The dielectric layer and the upper electrode may be sequentially formed both to fill the voids and to cover the lower electrodes and the supporting pattern.

Removing the upper portion of the mold layer may expose upper parts of the lower electrodes while lower parts of the lower electrodes remain covered by the lower portion of the mold layer. Forming the supporting pattern may include covering the upper parts of the lower electrodes and covering exposed regions of the lower portion of the mold layer with a supporting pattern layer.

The exposed regions of the lower portion of the mold layer may be formed by removing the upper portion of the mold layer before the supporting pattern layer is formed. The supporting pattern layer may be etched to form the supporting pattern before the dielectric layer and the upper electrode are formed. The supporting pattern layer may be etched such that the supporting pattern is formed as a continuous layer that encloses sidewalls of the upper parts of at least two of the lower electrodes.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1A:
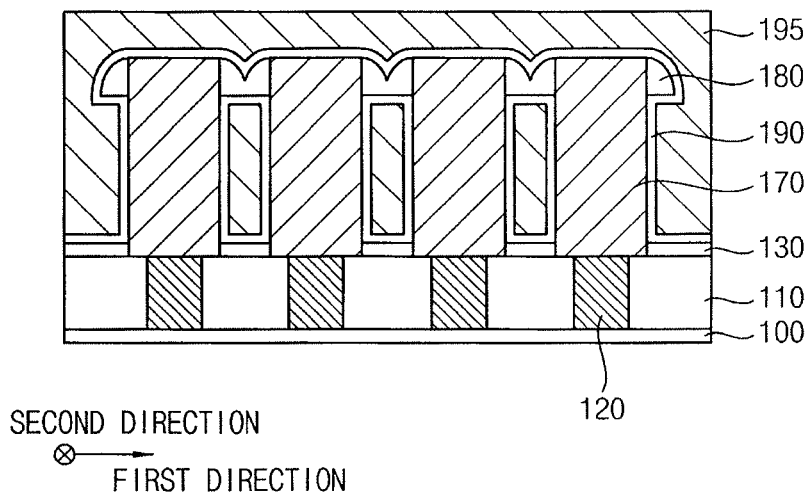
FIGS. 1A to 1C are cross-sectional and plan views illustrating a capacitor structure in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the sizes and relative sizes of layers and regions may be exaggerated for clarity. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 1B:
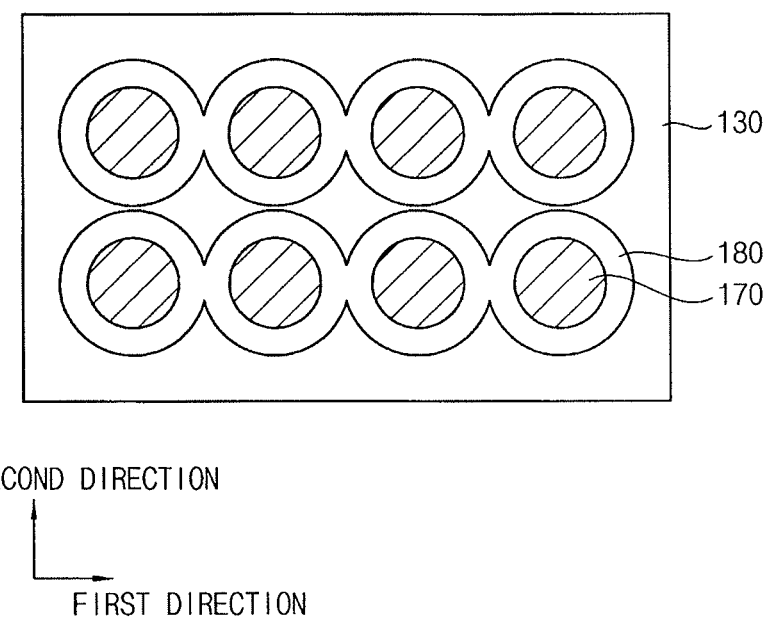
Figure 1C:
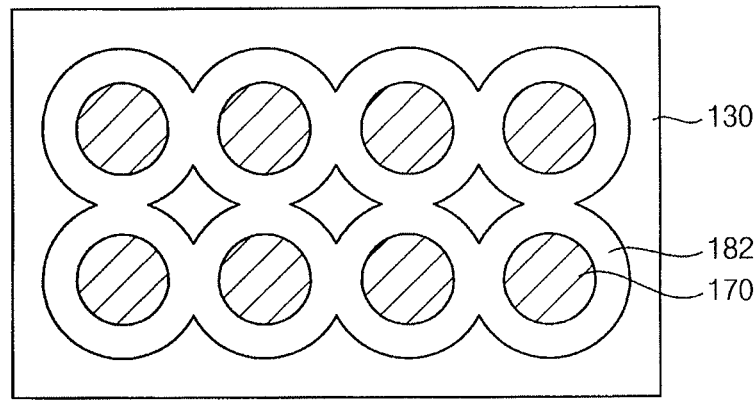

FIGS. 1A to 1C are cross-sectional and plan views illustrating a capacitor structure in accordance with example embodiments.

Referring to FIG. 1A, the capacitor structure may include a lower electrode 170, a supporting pattern 180, a dielectric layer 190, and an upper electrode 195 disposed on a substrate 100.

The substrate 100 may include a semiconductor substrate such as a silicon substrate, a germanium substrate, a silicon-on-insulator (SOI) substrate, a germanium-on-insulator (GOI) substrate, or the like. The substrate may further include a conductive region (not illustrated) having p-type or n-type impurities.

An insulating interlayer 110 may be disposed on the substrate 100. The insulating interlayer 110 may include silicon oxide, e.g., undoped silicate glass (USG), spin on glass (SOG), phosphosilicate glass (PSG), borophosphosilicate glass (BPSG), flowable oxide (FOX), tonen silazane (TOSZ), tetraethyl orthosilicate (TEOS), plasma enhanced-TEOS (PE-TEOS), high density plasma-chemical vapor deposition (HDP-CVD) oxide, or the like.

A plug 120 may be disposed on the substrate 100. For example, the plug 120 may extend through the insulating interlayer 110. In example embodiments, the plug 120 may be in contact with the conductive region of the substrate 100. A plurality of the plugs 120 may be arranged regularly in a first direction and a second direction, which second direction intersects and/or is substantially perpendicular to the first direction. The plug 120 may include, e.g., a metal or a metal nitride. For example, the plug 120 may include tungsten (W), titanium (Ti), aluminum (Al), copper (Cu), tantalum (Ta), tungsten nitride ($WN_x$), titanium nitride ($TiN_x$), aluminum nitride ($AlN_x$), tantalum nitride ($TaN_x$), titanium-aluminum nitride ($TiAl_xN_y$), or the like. According to another exemplary embodiment, the plug 120 may include doped polysilicon.

An etch-stop layer 130 may be disposed on the insulating interlayer 130. The etch-stop layer 130 may include, e.g., silicon nitride. In one example embodiment, the etch-stop layer 130 may be omitted.

The lower electrode 170 may be disposed on the insulating interlayer 110 to be in contact with, e.g., so as to be electrically connected to, the plug 120. In example embodiments, the lower electrode 170 may have a substantially pillar shape or a substantially solid cylindrical shape protruding vertically with respect to a top surface of the substrate 100.

Referring to FIGS. 1A to 1C, a plurality of the lower electrodes 170 may be arranged in the first direction to form a lower electrode row. Four lower electrodes 170 may define one lower electrode row as illustrated in FIGS. 1A and 1B. However, the number of the lower electrodes 170 included in the lower electrode row may not be specifically limited. Further, a plurality of the lower electrode rows may be arranged in the second direction. Two lower electrode rows that are adjacent to each other in the second direction are shown in FIGS. 1B and 1C, however, the number of the lower electrode rows may not be specifically limited.

The supporting pattern 180 may be disposed on an upper sidewall of the lower electrode 170. In example embodiments, the supporting pattern 180 may include silicon nitride, silicon oxynitride, or silicon carbonitride. These may be used alone or in a combination thereof.

In example embodiments, the supporting pattern may have a substantial spacer shape. For example, a width of the supporting pattern 180 may be increased from a top portion to a bottom portion thereof. When the lower electrode 170 has the substantially cylindrical shape, the supporting pattern 180 may enclose, e.g., completely enclose, an upper sidewall of the lower electrode 170, and cross-sections of the supporting pattern 180 parallel to the top surface of the substrate 100 may have substantially ring shapes. In this case, outer diameters of the cross-sections may be increased from a top surface of the lower electrode 170 to the bottom portion of the supporting pattern 180. The supporting pattern 180 may only enclose the upper sidewall of the lower electrode 170 so that a lower sidewall of the lower electrode 170 is exposed and in a non-overlapping relationship with the supporting pattern 180.

In example embodiments, uppermost surfaces of the supporting pattern 180 and the lower electrode 170 may be coplanar with each other, and/or the top portion of the supporting pattern 180 may be continuously connected to a top surface of the lower electrode 170.

As illustrated in FIG. 1B, the supporting pattern 180 may continuously extend in the first direction along the lower electrode row. In this case, the lower electrodes 170 of one lower electrode row may be connected to each other by the supporting pattern 180 in the first direction, e.g., so that the supporting pattern 180 is a single, continuous layer along the first direction. Therefore, the supporting pattern 180 may support the lower electrodes 170 included in the lower electrode row to reduce the possibility of and/or prevent the lower electrodes 170 from leaning or collapsing. According to an exemplary embodiment, the supporting pattern 180 may be discontinuous among the two lower electrode rows adjacent to each other in the second direction, e.g., so that in the second direction the supporting pattern 180 is not connected between adjacent lower electrode rows.

Referring now to FIG. 1A, the dielectric layer 190 covering the lower electrode 170 and the supporting pattern 180 may be disposed on the insulating interlayer 110 or the etch-stop layer 130. The dielectric layer 190 may include, e.g., silicon oxide-based or silicon nitride-based materials. According to another exemplary embodiment, the dielectric layer 190 may include a high-k material having a higher dielectric constant than dielectric constants of silicon oxide and silicon nitride. For example, the high-k material may include tantalum oxide, hafnium oxide, aluminum oxide, zirconium oxide, or the like. The dielectric layer 190 may have a single-layer structure or a multi-layered structure including a metal oxide layer, a silicon oxide layer, and/or a silicon nitride layer.

The upper electrode 195 may be disposed on the dielectric layer 190. The upper electrode 195 may include doped polysilicon, a metal, or a metal nitride. For example, the upper electrode 195 may include titanium, titanium nitride, aluminum, aluminum nitride, tantalum, tantalum nitride, or the like. These may be used alone or in a combination thereof.

The lower electrode 170 of, e.g., the substantially pillar shape, the dielectric layer 190, and the upper electrode 195 may define a capacitor. The plurality of the lower electrodes 170 may be connected and supported by the supporting pattern 180 along the first direction.

Referring to FIG. 1C, the lower electrode rows adjacent to each other in the both the first and second directions may be connected by a supporting pattern 182. For example, the adjacent lower electrodes 170 may be connected by the supporting pattern 182 in both the first and second directions. Thus, the lower electrodes 170 may be supported more efficiently. Additionally, the possibility of one lower electrode row being entirely pulled or separated out of the substrate 100 may be reduced and/or prevented. The support pattern 182 may be substantially similar to the supporting pattern 180.

Figure 2:
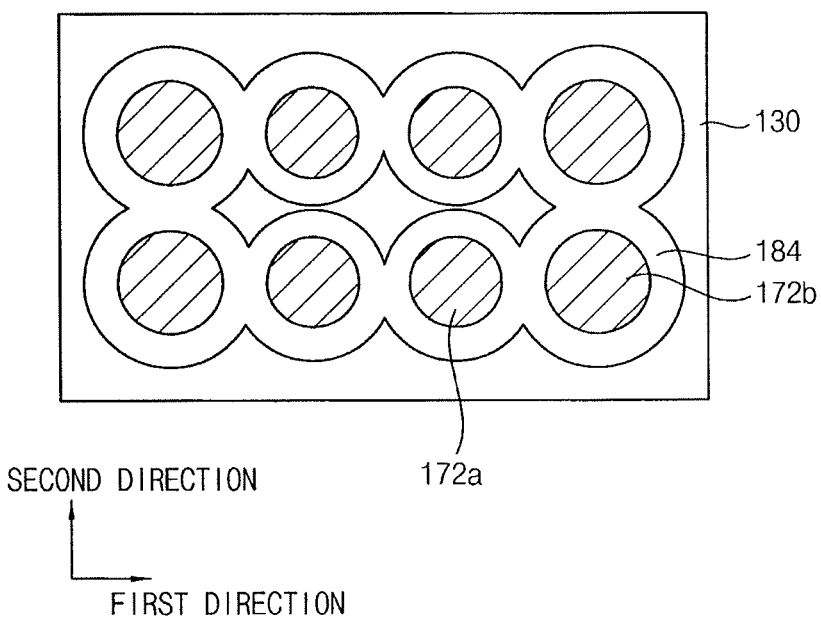
FIG. 2 is a plan view illustrating a capacitor structure in accordance with some example embodiments.

FIG. 2 is a plan view illustrating a capacitor structure in accordance with some example embodiments. The capacitor structure may have constructions and/or elements substantially the same as or similar to those illustrated in FIGS. 1A to 1C except for shapes of a lower electrode and/or a supporting pattern. Thus, detailed descriptions on repetitive elements and/or members are omitted.

Referring to FIG. 2, the lower electrode row may include first lower electrodes 172a and second lower electrodes 172b. The second lower electrodes 172b may be arranged at both opposing ends of the lower electrode row, and the first lower electrodes 172a may be arranged between the second lower electrodes 172b in the lower electrode row. In example embodiments, the second lower electrode 172b may have a width or a diameter substantially larger than that of the first lower electrode 172a.

The first and second lower electrodes 172a and 172b included in the one lower electrode row may be connected to one another by a supporting pattern 184 along the first direction. Additionally, the second lower electrodes 172b that may belong to different lower electrode rows and may be adjacent in the second direction may also be connected by the supporting pattern 184. The first lower electrodes 172a adjacent in the second direction may not be connected by the supporting pattern 184.

As illustrated in FIG. 2, the adjacent lower electrode rows may be connected to each other by the supporting pattern 184 so that the first and second lower electrodes 172a and 172b may be supported more efficiently. Additionally, the possibility of a lower electrode row being entirely pulled or separated out of the substrate 100 may be reduced and/or prevented.

In the case that the lower electrodes 170 are entirely connected by the supporting pattern 182 in both the first and second directions as illustrated in FIG. 1C, a comparative total volume of a supporting pattern may be increased, which could potentially result in defects such as cracks in the supporting pattern. Thus, according to an exemplary embodiment, a plurality of the lower electrode rows may be configured to be connected by the supporting pattern 184 only through the peripheral second lower electrodes 172b as illustrated in FIG. 2.

Figure 3A:
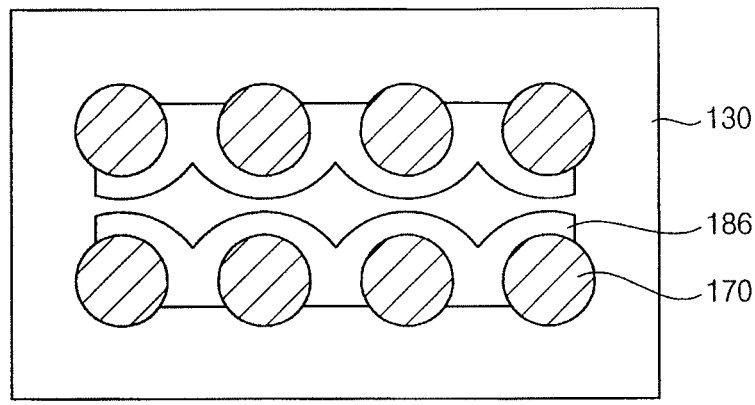
FIGS. 3A to 3C are plan views illustrating a capacitor structure in accordance with some example embodiments.
Figure 3A:
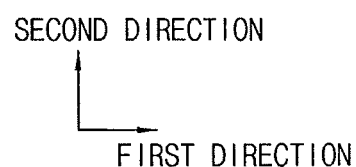
Figure 3B:
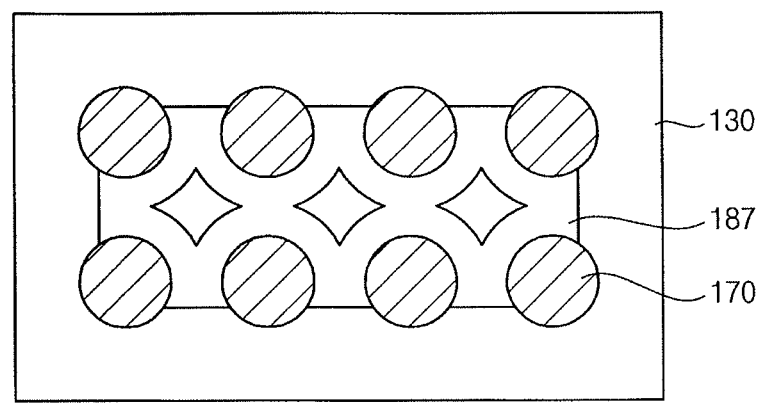
Figure 3B:
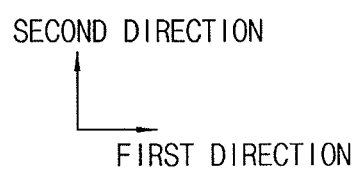
Figure 3C:
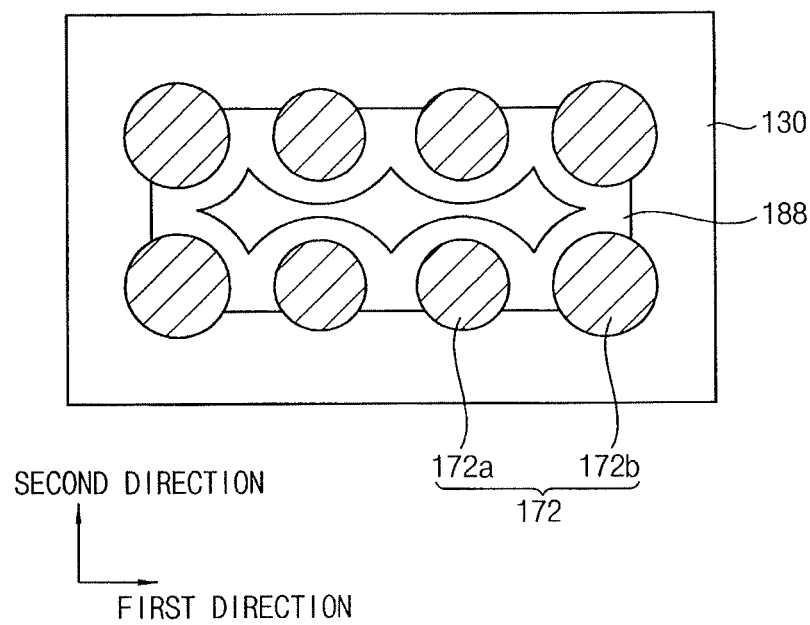

FIGS. 3A to 3C are plan views illustrating a capacitor structure in accordance with some example embodiments. The capacitor structure may have constructions and/or elements substantially the same as or similar to those illustrated in FIGS. 1A to 1C except for shapes of a lower electrode and/or a supporting pattern. Thus, detailed descriptions on repetitive elements and/or members are omitted.

Referring to FIG. 3A, a supporting pattern 186 may partially enclose the upper sidewall of the lower electrode 170. As described with reference to FIGS. 1B, 1C, and 2, the supporting patterns 180, 182, and 184 may enclose an entirety of the upper sidewall of the lower electrodes 170, 172a, and 172b to connect adjacent ones of the lower electrodes 170, 172a, and 172b to each other. In this case, a large amount of a deposition material may be required to form the supporting pattern 180, 182, and 184, and a deposition thickness may be also increased. Thus, mechanical and/or structural stability of the supporting pattern 180, 182, and 184 may be reduced. According to another exemplary embodiment, the supporting pattern 186 may be formed only on a partial portion, e.g., partial circumference or partial parameter, of the upper sidewall of the lower electrode 170 along one lower electrode row. Therefore, an amount of the deposition material and the deposition thickness for forming the supporting pattern 186 may be decreased.

In example embodiments, the supporting pattern 186 may connect the lower electrodes 170 included in the one lower electrode row in the first direction. In this case, the lower electrode rows adjacent in the second direction may not be connected to each other by the supporting pattern 186.

In one example embodiment, the lower electrodes 170 included in two adjacent lower electrode rows may be entirely connected by a supporting pattern 187 as illustrated in FIG. 3B. The support pattern 187 may have various openings and/or voids in region between the lower electrode rows in at least one of the first and second directions. For example, one opening and/or void may be enclosed by four of the lower electrodes 170. The openings and/or voids may be defined by a polygonal boundary.

FIG. 3C illustrates that the supporting pattern 188 and the lower electrodes 172 may form the rectangular array. However, the array may have other various shapes and the number of the lower electrodes included in the array may be properly adjusted.

In one example embodiment, the second lower electrodes 172b may be arranged at the both ends of the lower electrode row, and the first lower electrodes 172a may be arranged between the two second lower electrodes 172b. The second lower electrode 172b may have a diameter or a width larger than that of the first electrode 172a. In this case, the second lower electrodes 172b adjacent in the second direction may be connected by a supporting pattern 188 and the first lower electrodes 172a adjacent in the second direction may not be connected by the supporting pattern 188. Thus, the lower electrodes 172 included in the two lower electrode rows may form a substantially rectangular array by the supporting pattern 188 and a plurality of the arrays may be formed on the substrate 100. Four second lower electrodes 172b may be located at four vertexes of the rectangular array, respectively. A portion of the upper sidewalls of the lower electrodes 172 on which the supporting pattern 188 is not formed may be exposed from an outside of the array.

Figure 6:
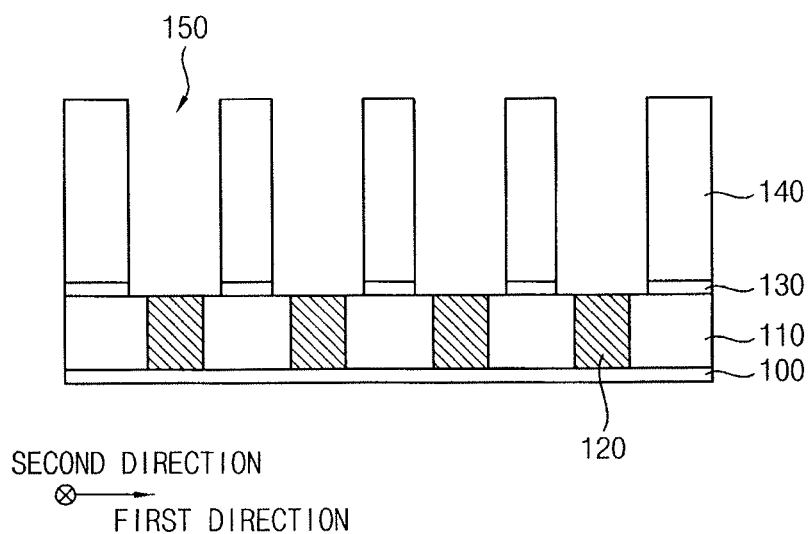
Figure 7:
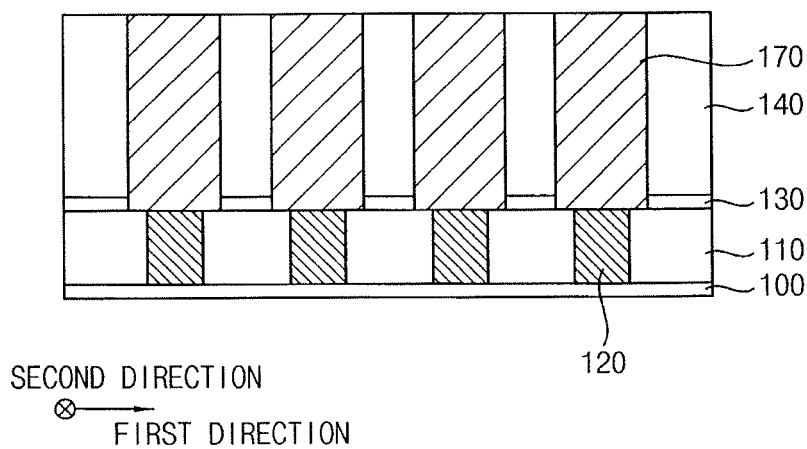
Figure 8:
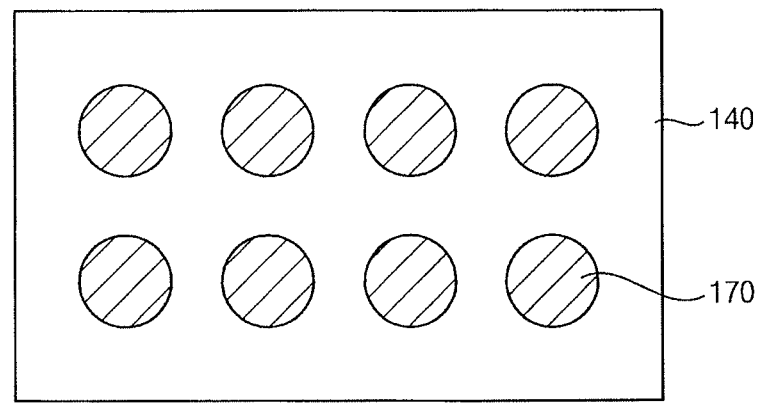
Figure 8:
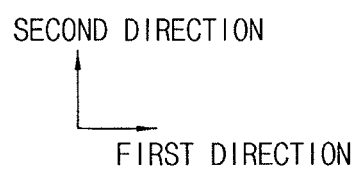

FIGS. 4 to 13 illustrate cross-sectional and plan views depicting stages in a method of forming a capacitor structure in accordance with example embodiments. Specifically, FIGS. 4 to 7, 9, 10, 12, and 13 illustrate cross-sectional views depicting stages in the method of forming the capacitor structure. FIG. 8 is a top plan view of the FIG. 7. FIGS. 11A and 11B are top plan views of FIG. 10.

Figure 4:
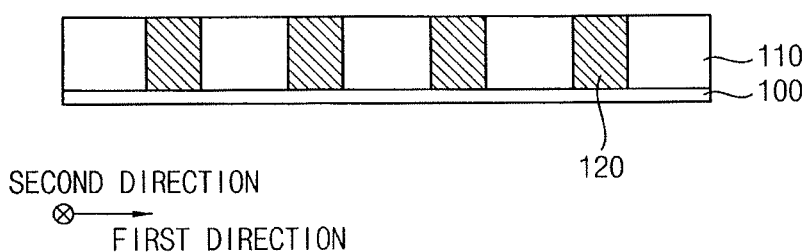
FIGS. 4, 5, 6, 7, 8, 9, 10, 11A, 11B, 12, and 13 are cross-sectional and plan views depicting stages in a method of forming a capacitor structure in accordance with example embodiments.

Referring to FIG. 4, an insulating interlayer 110 may be formed on a substrate 100, and a plurality of plugs 120 may be formed through the insulating interlayer 110.

The substrate 100 may be a semiconductor substrate such as a silicon substrate, a germanium substrate, an SOI substrate, a GOI substrate, or the like. The substrate may further include a conductive region (not illustrated) having p-type or n-type impurities.

The insulating interlayer 110 may be formed using silicon oxide. For example, the insulating interlayer 110 may be formed using USG, SOG, PSG, BPSG, FOX, TOSZ, TEOS, PE-TEOS, HDP-CVD oxide, or the like. The insulating interlayer 110 may be obtained by a chemical vapor deposition (CVD) process, a plasma-enhanced CVD (PECVD) process, a spin coating process, an HDP-CVD process, or the like.

The plug 120 may penetrate through the insulating interlayer 110 to be in contact the substrate 100. For example, the plurality of plugs 120 may extend through an entirety of the insulating interlayer 110 so as to be electrically connected to a structure thereunder. For example, the plug 120 may be in contact with the conductive region formed on the substrate 100. The plurality of the plugs 120 may be arranged regularly in a first direction and a second direction substantially perpendicular to the first direction.

In example embodiments, the insulating interlayer 110 may be partially removed to form a plurality of holes (not illustrated) partially exposing the substrate 100. A conductive layer sufficiently filling the holes may be formed on the insulating interlayer 110 and the substrate 100. An upper portion of the conductive layer may be planarized by, e.g., a chemical mechanical polishing (CMP) process or an etch-back process until a top surface of the insulating interlayer 110 is exposed, thereby to obtain the plugs 120 filling the holes.

For example, the conductive layer may be formed using doped polysilicon, a metal and/or a metal nitride. Examples of the metal and the metal nitride may include tungsten (W), titanium (Ti), aluminum (Al), copper (Cu), tantalum (Ta), tungsten nitride, titanium nitride, aluminum nitride, tantalum nitride, titanium-aluminum nitride, or the like. These may be used alone or in a combination thereof. The conductive layer may be obtained by a physical vapor deposition (PVD) process, an atomic layer deposition (ALD) process, a sputtering process, or the like.

Figure 5:
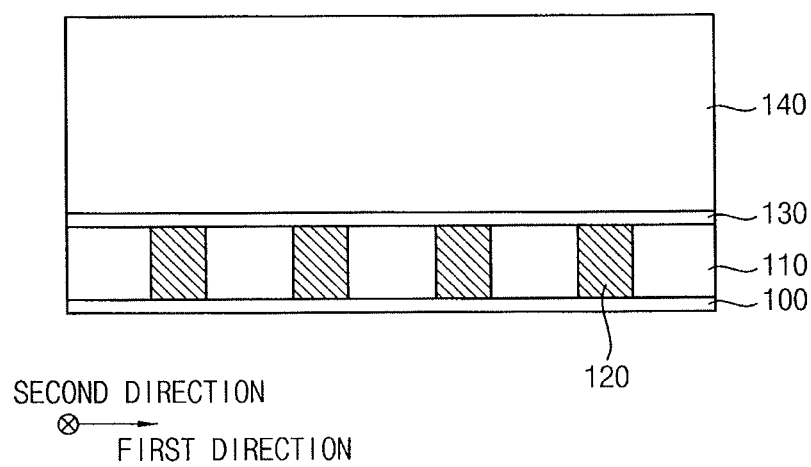

Referring to FIG. 5, an etch-stop layer 130 and a mold layer 140 may be sequentially formed on the insulating interlayer 110 and the plug 120.

The etch-stop layer 130 may be formed using, e.g., silicon nitride, by a CVD process, a PECVD process, a spin coating process, an HDP-CVD process, or the like. The etch-stop layer 130 may serve as an end point of an etching process when an opening 150 (see FIG. 6) is formed. In one example embodiment, the etch-stop layer 130 may not be formed.

The mold layer 140 may be formed on the etch-stop layer 130. The mole layer 140 may be formed using silicon oxide such as BPSG, PSG, USG, SOG, FOX, TOSZ, TEOS, PE-TEOS, HDP-CVD oxide, or the like. The mold layer 140 may be obtained by a CVD process, a spin coating process, a PECVD process, or the like.

Referring to FIG. 6, the mold layer 140 and the etch-stop layer 130 may be partially etched to form a plurality of the openings 150 through which the plugs 120 may be exposed. The openings 150 may be spaced apart, and each of the openings 150 may expose an entirety of one of the plugs 120 and portions of the insulating interlayer 110 surrounding the one of the plugs 120.

In example embodiments, a first etching process may be performed to partially remove the mold layer 140 to expose the etch-stop layer 130, and then a second etching process may be performed to remove the exposed etch-stop layer 130 such that the plugs 120 may be exposed. The first and second etching processes may include dry etching processes in which different etching gases may be utilized. For example, the etching gas for the first etching process may include HF, and the etching gas for the second etching process may include $CH_3F$, $CHF_3$, $CF_4$, $C_2F_6$, $NF_3$, or the like. In the case that the etch-stop layer 130 is not formed, the second etching process may be omitted.

Referring to FIG. 7, a lower electrode 170 filling each opening 150 may be formed to make contact with the plug 120 exposed by the opening 150.

In example embodiments, a lower electrode layer sufficiently and/or substantially filling the opening 150 may be formed on an upper side of the mold layer 140. The lower electrode layer may be formed using a metal or a metal nitride. For example, the lower electrode layer may be formed using Cu, Al, W, platinum (Pt), rubidium (Rb), iridium, (Ir), titanium nitride, tantalum nitride, tungsten nitride, or the like. Alternatively, the lower electrode layer may be formed using doped polysilicon. The lower electrode layer may be obtained by a sputtering process, a PVD process, an ALD process. An upper portion of the lower electrode layer may be planarized by a CMP process or an etch-back process until a top surface of the mold layer 140 is exposed, thereby to obtain the lower electrode 170 within the opening 150.

In example embodiments, the lower electrode 170 may have a substantially pillar shape or a substantially solid cylindrical shape that may protrude vertically relative to a top surface of the substrate 100.

Referring to FIG. 8 that is a top plan view of FIG. 7, a plurality of the lower electrodes 170 may be buried in the mold layer 140 and arranged regularly in the first and second directions. For example, the plurality of the lower electrodes 170 may be arranged in the first direction to form a lower electrode row, and a plurality of the lower electrode rows may be arranged in the second direction. The number of the lower electrode rows and the number of the lower electrodes 170 included in the lower electrode row are not specifically limited.

Figure 9:
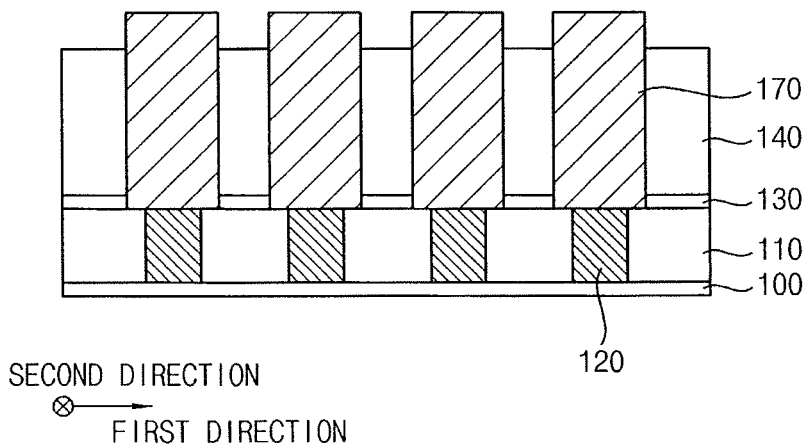

Referring to FIG. 9, an upper portion of the mold layer 140 may be removed to expose upper portions of the lower electrodes 170. In example embodiments, the upper portion of the mold layer 140 may be removed by an etch-back process. Accordingly, the lower electrodes 170 may protrude from the mold layer 140, e.g., uppermost surfaces of the lower electrodes 170 may be at a height relative to the substrate 100 that is greater than a height relative to the substrate 100 of an uppermost surface of the mold layer 140.

Figure 10:
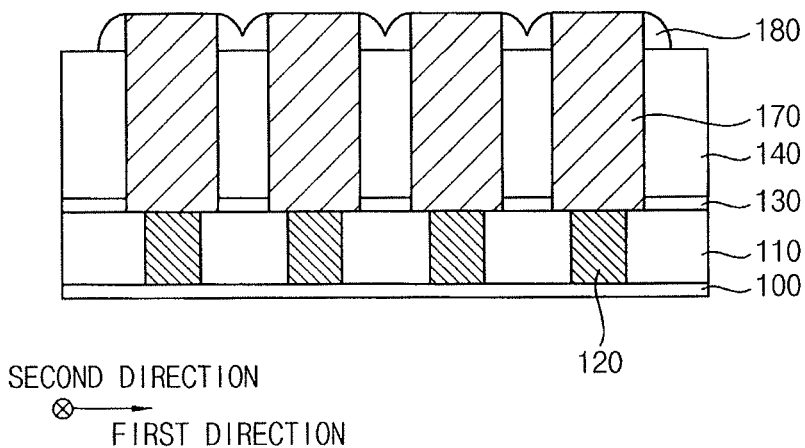

Referring to FIG. 10, a supporting pattern 180 may be formed on the top surface of the mold layer 140 and on exposed sidewalls of the lower electrodes 170.

In example embodiments, a supporting layer covering the exposed portions of the lower electrodes 170 may be formed on the mold layer 140. The supporting layer may be anisotropically etched to form the supporting pattern 180. The supporting layer may be formed using silicon nitride, silicon oxynitride, or silicon carbonitride. These may be used alone or in a combination thereof. The supporting layer may be obtained by a CVD process, a PECVD process, a PVD process, or the like.

In example embodiments, the supporting pattern 180 may have a substantial spacer shape enclosing the exposed sidewalls of the lower electrodes 170 and exposing an upper side of the lower electrodes 170. For example, a width of the supporting pattern 180 may increase from a top portion to a bottom portion thereof. For example, as a distance from the substrate 100 increases, a width of the support pattern 180 measured along the first direction may decrease. When the lower electrode 170 has the substantially solid cylindrical shape, cross-sections of the supporting pattern 180 parallel to the top surface of the substrate 100 may have substantially ring shapes. In this case, outer diameters of the cross-sections may be increased from a top surface of the lower electrode 170 to the bottom portion of the supporting pattern 180. In example embodiments, top surfaces of the supporting pattern 180 and the lower electrode 170 may be coplanar with each other, or the top portion of the supporting pattern 180 may be continuously connected to the top surface of the lower electrode 170.

Figure 11A:
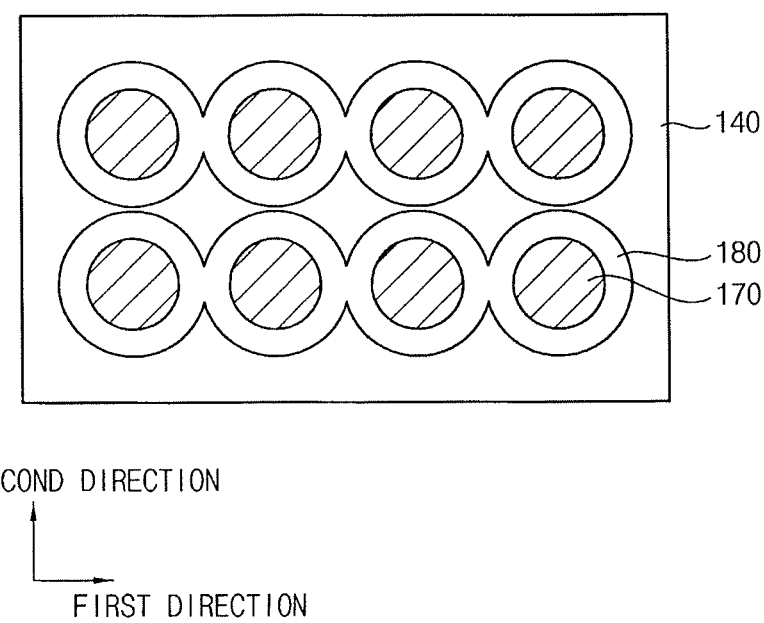

Referring to FIG. 11A that is a top plan view of FIG. 10, the lower electrodes 170 included in one lower electrode row may be connected by the supporting pattern 180. The supporting pattern 180 may support the lower electrode row in the first direction to reduce the possibility of and/or prevent the lower electrodes in the one lower electrode row from leaning or collapsing. The lower electrode rows adjacent in the second direction may not be connected by the supporting pattern 180.

Figure 11B:
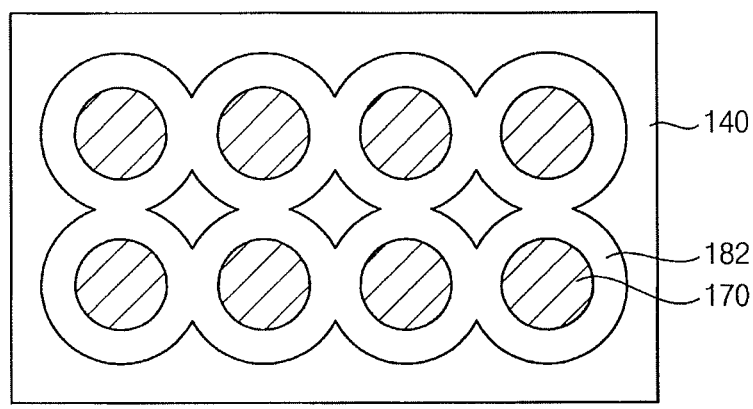
Figure 11B:
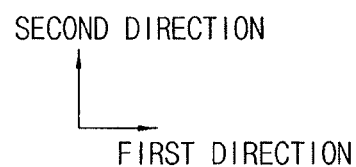

Referring to FIG. 11B, a deposition thickness of the supporting layer may be increased or a distance between the adjacent lower electrode rows may be reduced. Accordingly, the lower electrodes 170 included in at least two adjacent lower electrode lows may be entirely connected by a supporting pattern 182. For example, the lower electrodes 170 adjacent both in the first and second directions may be entirely connected by the supporting pattern 182. Thus, the lower electrodes 170 may be supported more efficiently. Additionally, the possibility of the one lower electrode row being pulled or separated out of the substrate 100 by, e.g., an external shock, may be reduced and/or prevented. FIG. 11B illustrates that two lower electrode rows are connected by the supporting pattern 182. However, more than two lower electrode rows may be connected by the supporting pattern 182.

Figure 12:
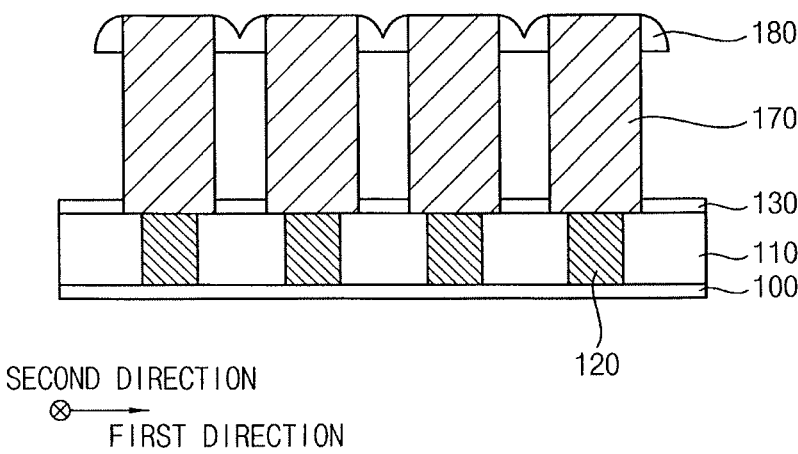

Referring to FIG. 12, the mold layer 140 may be removed. In example embodiments, the mold layer 140 may be removed using an etching solution that may have a high etching selectivity with respect to silicon oxide. For example, the etching solution may include a hydrofluoric acid (HF) solution, a buffer oxide etchant (BOE) solution, an LAL solution, or the like. The removal of the mold layer 140 may leave voids under the supporting pattern 180.

Figure 13:
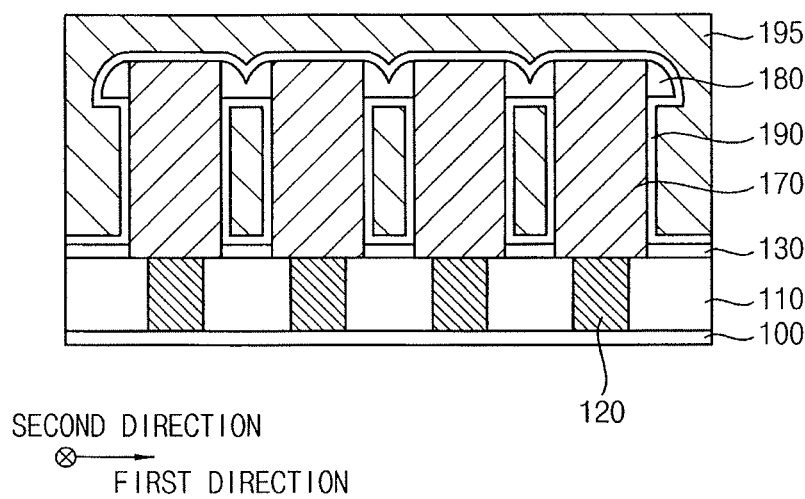

Referring to FIG. 13, a dielectric layer 190 covering both the lower electrode 170 and the supporting pattern 180, may be formed on the etch-stop layer 130. An upper electrode 195 may be formed on the dielectric layer 190. The dielectric layer 190 and the upper electrode 195 may fill the voids under the supporting pattern 180 formed by the removal of the mold layer 140. Accordingly, a capacitor structure including the lower electrode 170 of, e.g., the substantially pillar shape, the dielectric layer 190 and the upper electrode 195 may be obtained. In the capacitor structure, the plurality of the lower electrodes 170 may be supported by the supporting pattern 180.

The dielectric layer 190 may be formed using, e.g., silicon oxide-based or silicon nitride-based materials. According to another embodiment, the dielectric layer 190 may be formed using a high-k material having a dielectric constant greater than that of silicon oxide and silicon nitride. The high-k material may include a metal oxide such as tantalum oxide, hafnium oxide, aluminum oxide, zirconium oxide, or the like. The dielectric layer 190 may have a multi-layered structure including a metal oxide layer, a silicon oxide layer, and/or a silicon nitride layer. The dielectric layer 190 may be obtained by a CVD process, a PVD process, an ALD process, or the like.

The upper electrode 195 may be formed using, e.g., a metal or a metal nitride such as titanium, titanium nitride, aluminum, aluminum nitride, tantalum, tantalum nitride, or the like. According to another exemplary embodiment, the upper electrode 195 may be formed using doped polysilicon. The lower electrode 195 may be obtained by a PVD process, a sputtering process, an ALD process, or the like.

According to example embodiments, an etching process or a patterning process for forming the supporting pattern 180 may be performed after forming the lower electrode 170. Thus, different layers (e.g., a silicon oxide layer and silicon nitride layer) may not be etched simultaneously in order to form the supporting pattern and an opening in which a lower electrode is formed. Therefore, defects generated during the etching process for forming the opening, e.g., a void, a crack, a seam, and an irregular profile of a sidewall of the opening, may be avoided.

Further, the lower electrodes may be vertically stacked to increase an aspect ratio thereof. In this case, the supporting pattern may be formed on an uppermost lower electrode in accordance with example embodiments.

Figure 14:
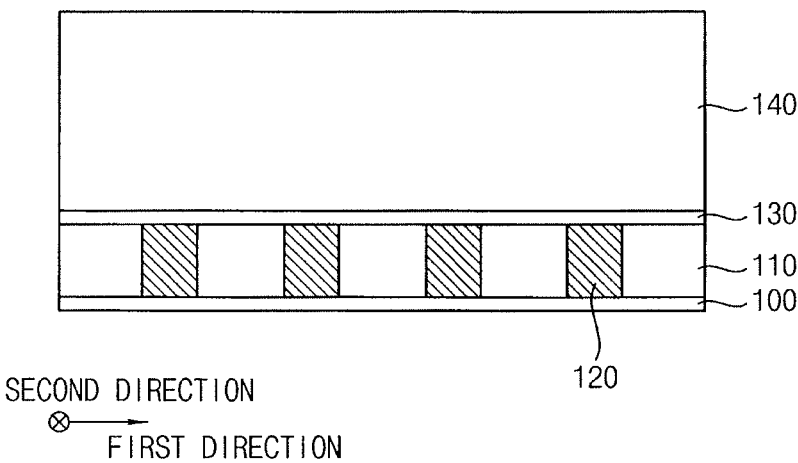
FIGS. 14 to 21 are cross-sectional and plan views depicting stages in a method of forming a capacitor structure in accordance with some example embodiments.
Figure 15:
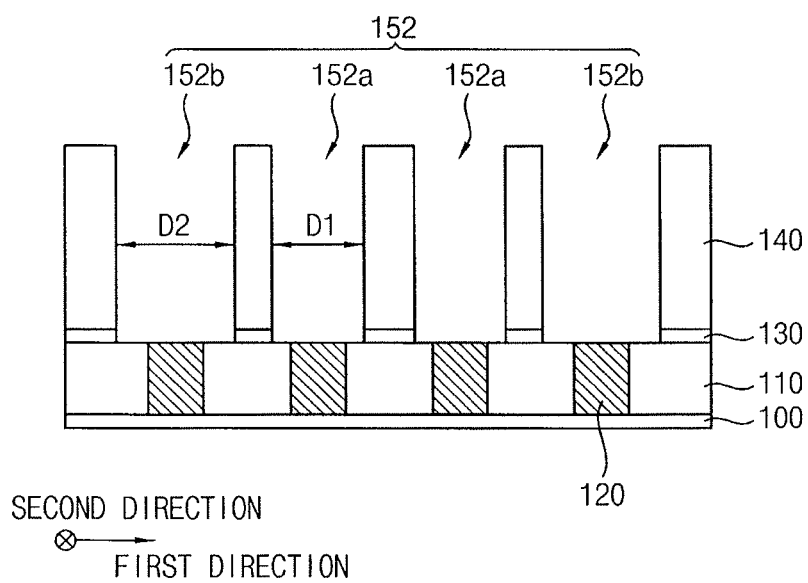
Figure 16:
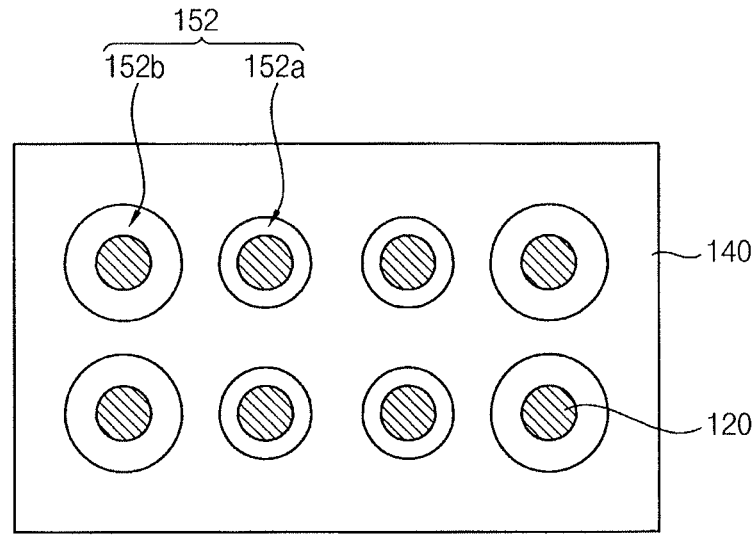
Figure 17:
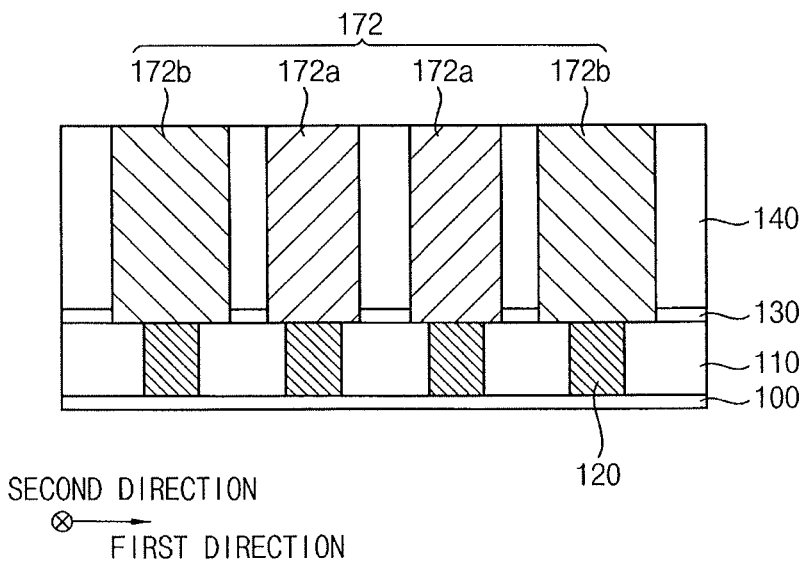
Figure 18:
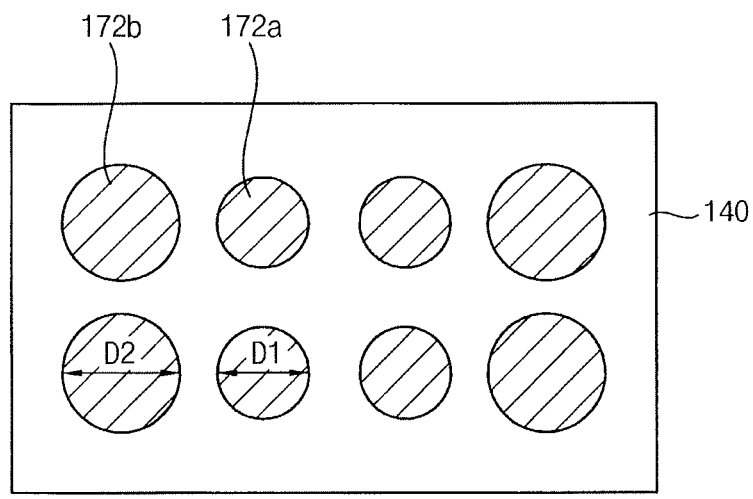
Figure 19:
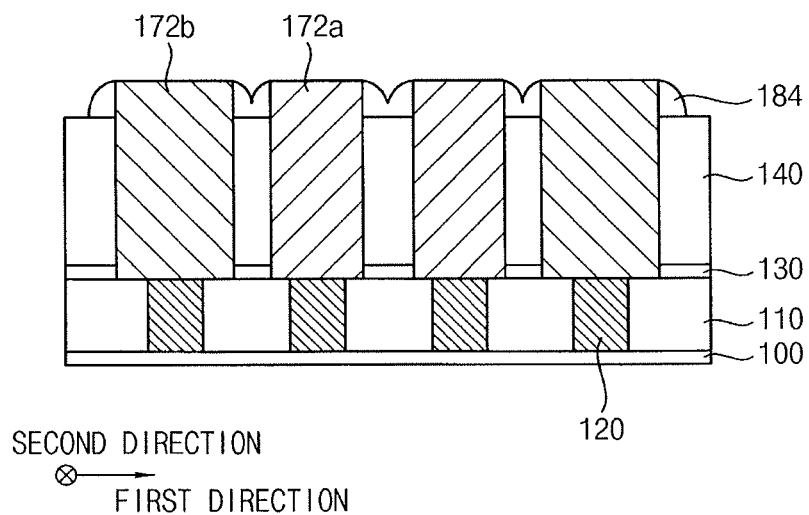
Figure 20:
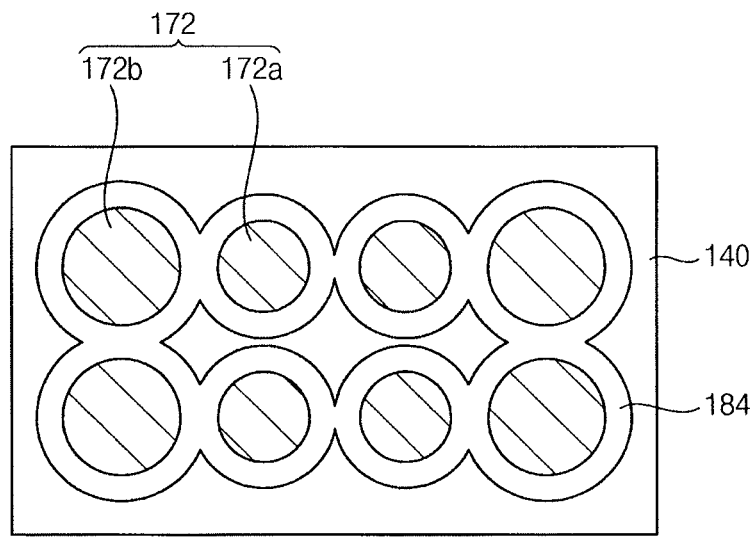

FIGS. 14 to 21 illustrate cross-sectional and plan views depicting stages in a method of forming a capacitor structure in accordance with some example embodiments. Specifically, FIGS. 14, 15, 17, 19 and 21 are cross-sectional views illustrating the method of forming the capacitor structure. FIGS. 16, 18 and 20 are top plan views of FIGS. 15, 17 and 19, respectively.

Detailed descriptions about processes substantially the same as or similar to those illustrated with reference to FIGS. 4 to 13 are omitted.

Referring to FIG. 14, processes substantially the same as or similar to those illustrated with reference to FIGS. 4 and 5 may be performed. Accordingly, the insulating interlayer 110 may be formed on the substrate, and the plurality of the plugs 120 may be formed through the insulating interlayer 110. The etch-stop layer 130 and the mold layer 140 may be sequentially formed on the insulating interlayer 110 and the plugs 120.

Referring to FIGS. 15 and 16, a process substantially the same as or similar to that illustrated with reference to FIG. 6 may be performed to partially remove the mold layer 140 and the etch-stop layer 130. Accordingly, an opening 152 exposing the plug 120 may be formed. A plurality of the openings 152 may form an opening row in a first direction and a plurality of the opening rows may be arranged in a second direction substantially perpendicular to the first direction.

In example embodiments, the opening row may include second openings 152b formed at both ends of the opening row and first openings 152a formed between the second openings 152b. The number of the first opening 152a is not specifically limited.

The first opening 152a and the second opening 152b may have a width or a diameter, e.g., as measured in the first direction, indicated by a first width "D1" and a second width "D2", respectively. In example embodiments, the second width D2 may be larger than the first width D1. Thus, a distance between the second openings 152b adjacent in the second direction may be smaller than a distance between the first openings 152a adjacent in the second direction.

Referring to FIGS. 17 and 18, a process substantially the same as or similar to that illustrated with reference to FIG. 7 may be performed to form lower electrodes 172 filling the openings 152 and making contact with the plugs 120. The lower electrode 172 may have a substantially pillar shape or a substantially solid cylindrical shape.

In example embodiments, a plurality of the lower electrodes 172 may be arranged in the first direction to form a lower electrode row, and a plurality of the lower electrode rows may be arranged in the second direction.

The lower electrode row may include second lower electrodes 172b at both ends of the lower electrode row and first electrodes 172a between the second lower electrodes 172b. A width or a diameter of the second lower electrode 172b may be substantially the same as the second width D2, and a width or a diameter of the first lower electrode 172a may be substantially the same as the first width D1. Thus, the second lower electrode 172b may have the width or the diameter substantially larger than that of the first electrode 172a. Thus, a distance between the second lower electrodes 172b adjacent in the second direction may be smaller than a distance between the first lower electrodes 172a adjacent in the second direction.

Referring to FIG. 19, processes substantially the same as or similar to those illustrated with reference to FIGS. 9 and 10 may be performed. Thus, an upper portion of the mold layer 140 may be removed, and a supporting pattern 184 may be formed on the mold layer and upper sidewalls of the lower electrodes 172.

Referring to FIG. 20, the first and second lower electrodes 172a and 172b included in one lower electrode row may be connected to one another by the supporting pattern 184 along the first direction. The second lower electrodes 172b that may belong to different lower electrode rows along the second direction and may be adjacent in the second direction may also be connected by the supporting pattern 184. The first lower electrodes 172a adjacent in the second direction may not be connected by the supporting pattern 184.

In example embodiments, the adjacent lower electrode rows may be connected to each other by the supporting pattern 184 via the peripheral second lower electrodes 172b so that the lower electrodes 172 may be supported more efficiently. The possibility of the one lower electrode row being entirely pulled or separated out of the substrate 100 may be reduced and/or prevented. Further, a plurality of the lower electrode rows may be configured to be connected along the second direction only through the outermost second lower electrodes 172b so that a total volume of the supporting pattern 184 may be reduced. Thus, the possibility of defects such as cracks or seams in the supporting pattern 184 may be reduced and/or prevented from occurring.

Figure 21:
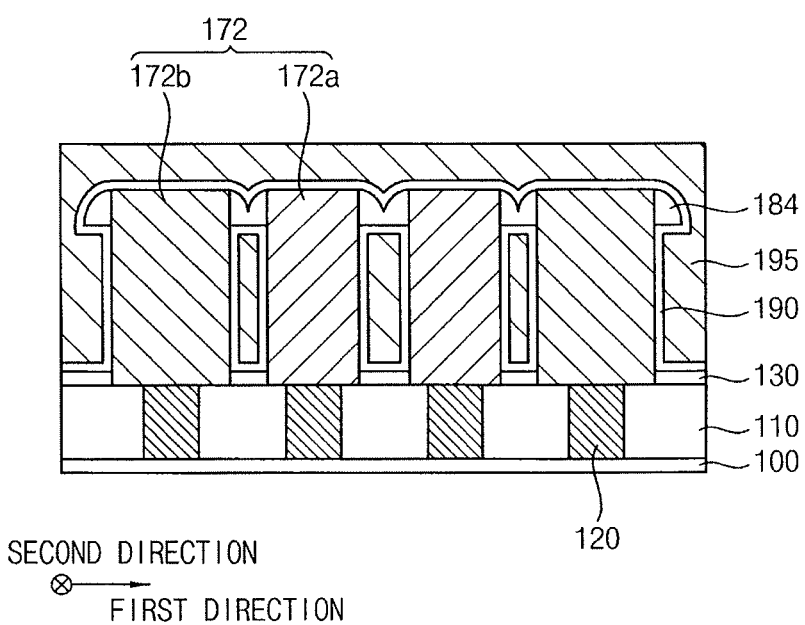

Referring to FIG. 21, processes substantially the same as or similar to those illustrated with reference to FIGS. 12 and 13 may be performed. Accordingly, the mold layer 140 may be removed, and then the dielectric layer 190 and the upper electrode 195 may be sequentially formed on the lower electrode 172, the supporting pattern 184, and the etch-stop layer 130.

FIGS. 22 to 32 illustrate cross-sectional and plan views depicting stages in a method of forming a capacitor structure in accordance with some example embodiments. Specifically, FIGS. 22, 24, 26 to 28, 30 and 32 are cross-sectional views illustrating the method of forming the capacitor structure. FIGS. 23, 25, 29A to 29C, and 31 are plan views illustrating the method of forming the capacitor structure. Detailed descriptions about processes and elements substantially the same as or similar to those illustrated with reference to FIGS. 4 to 13 are omitted.

Figure 22:
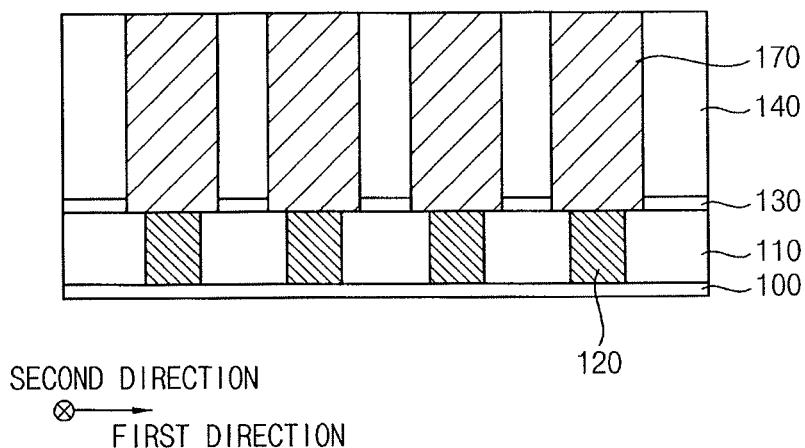
FIGS. 22, 23, 24, 25, 26, 27, 28, 29A, 29B, 29C, 30, 31, and 32 are cross-sectional and plan views depicting stages a method of forming a capacitor structure in accordance with some example embodiments.
Figure 23:
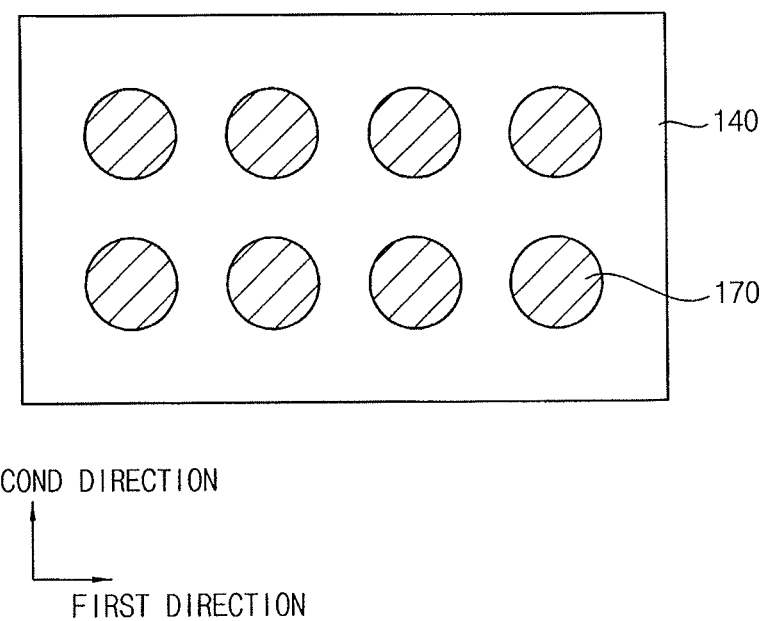

Referring to FIG. 22 and FIG. 23 that is a top plan view of FIG. 22, processes substantially the same as or similar to those illustrated with reference to FIGS. 4 to 8 may be performed. Thus, the lower electrodes 170 may be formed through the mold layer 140 and the etch-stop layer 130 to be in contact with the plugs 120.

Figure 24:
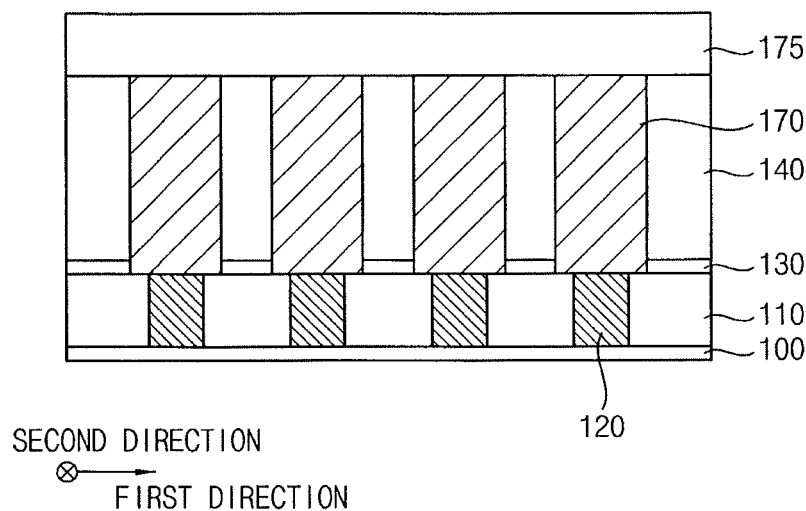
Figure 25:
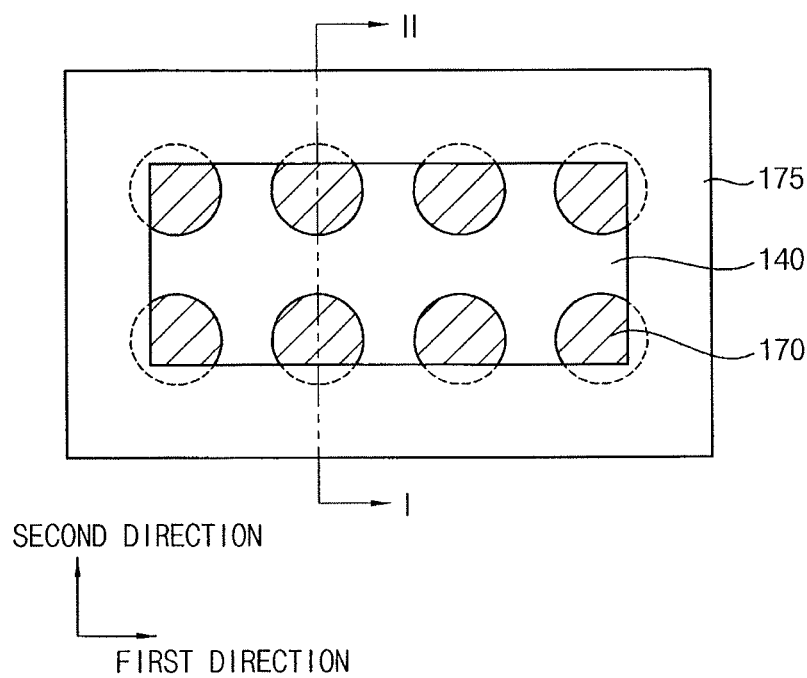
Figure 26:
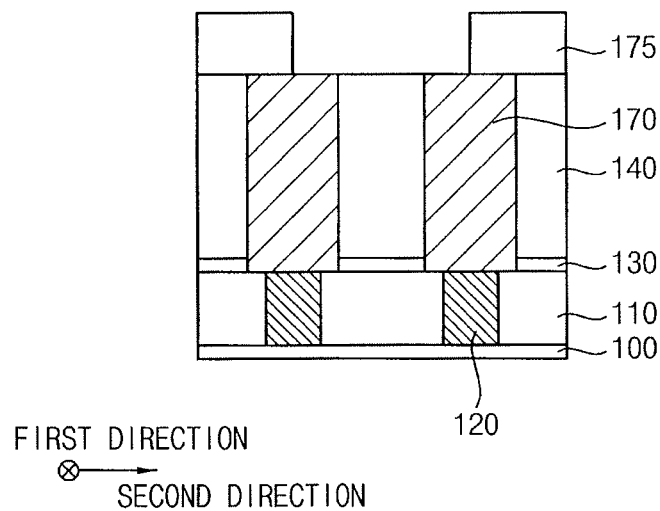

Referring to FIG. 24, FIG. 25 that is a top plan view of FIG. 24, and FIG. 26 that is a cross-sectional view taken along a line I-II of FIG. 25, a mask 175 partially covering the each lower electrode 170 may be formed on the mold layer 140. In example embodiments, the mask 175 may partially cover two lower electrode rows adjacent in the second direction. The lower electrodes 170 included in the lower electrode rows may be partially exposed by the mask 175. In example embodiments, the mask 175 may include a window having a substantially rectangular shape. The mask 175 may include line patterns extending in the first direction as illustrated in FIGS. 24 to 26.

The mask 175 may include, e.g., a photoresist material, a silicon based spin-on hard mask (Si—SOH) material, polysilicon, amorphous silicon, amorphous carbon, or the like.

Figure 27:
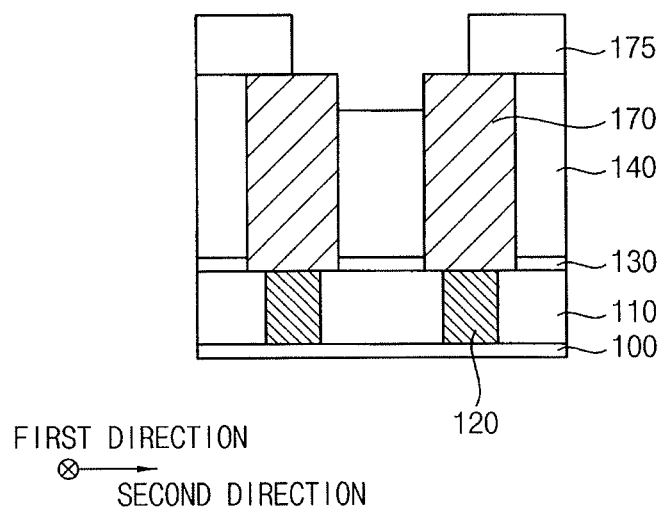

Referring to FIG. 27, an upper portion of the mold layer exposed by the mask 175 may be partially removed by, e.g., an etch-back process. Thus, upper sidewalls of the lower electrodes 170 may be partially exposed.

The mask 175 may be removed by, e.g., an ashing process or a strip process.

Figure 28:
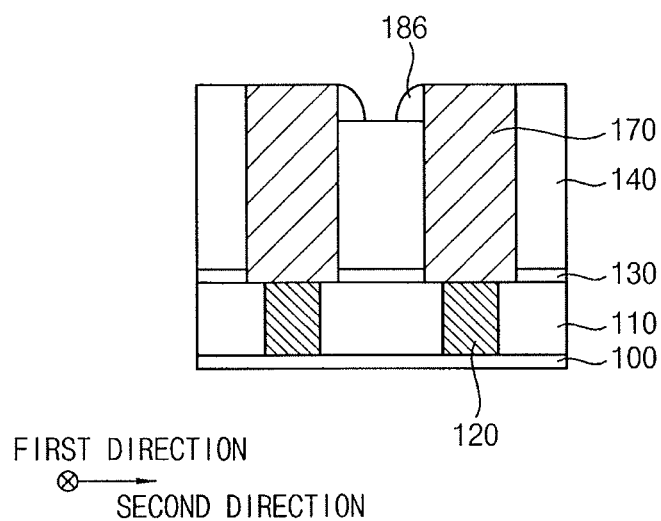
Figure 29A:
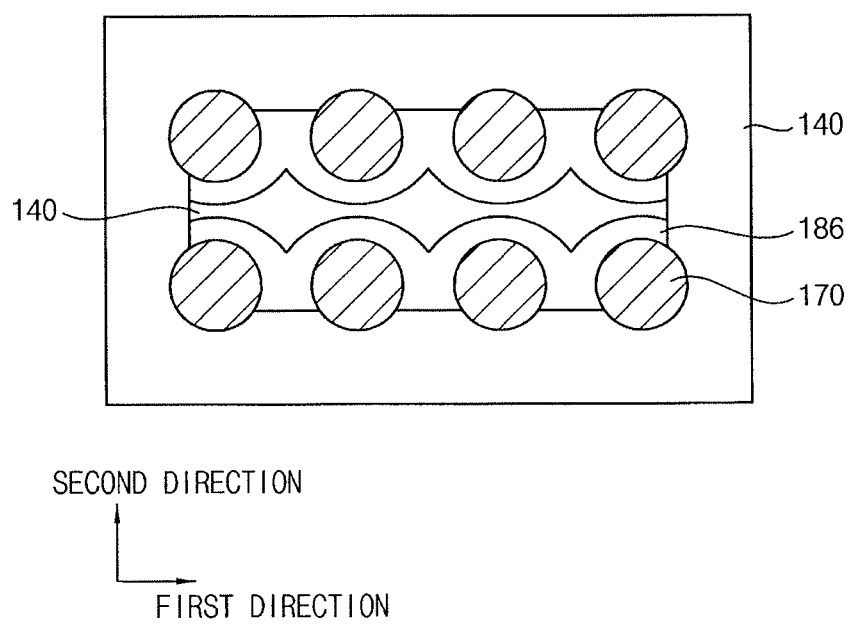

Referring to FIG. 28 and FIG. 29A that is a top plan view of FIG. 28, a process substantially the same as or similar to that illustrated with reference to FIG. 10 may be performed. Accordingly, a supporting pattern 186 having a substantial spacer shape may be formed on the exposed upper sidewalls of the lower electrodes 170.

In example embodiments, the supporting pattern 186 may partially enclose the upper sidewalls of the lower electrodes 170 to connect the adjacent lower electrodes 170 to each other. The supporting pattern 186 may not entirely enclose the upper sidewall of the lower electrode 170 so that an amount of a deposition material or a deposition thickness for forming the supporting pattern 186 may be reduced.

In example embodiments, the supporting pattern 186 may connect the lower electrodes 170 included in one lower electrode row as illustrated in FIG. 29A. The lower electrode rows adjacent in the second direction may not be connected to each other by the supporting pattern 186.

Figure 29B:
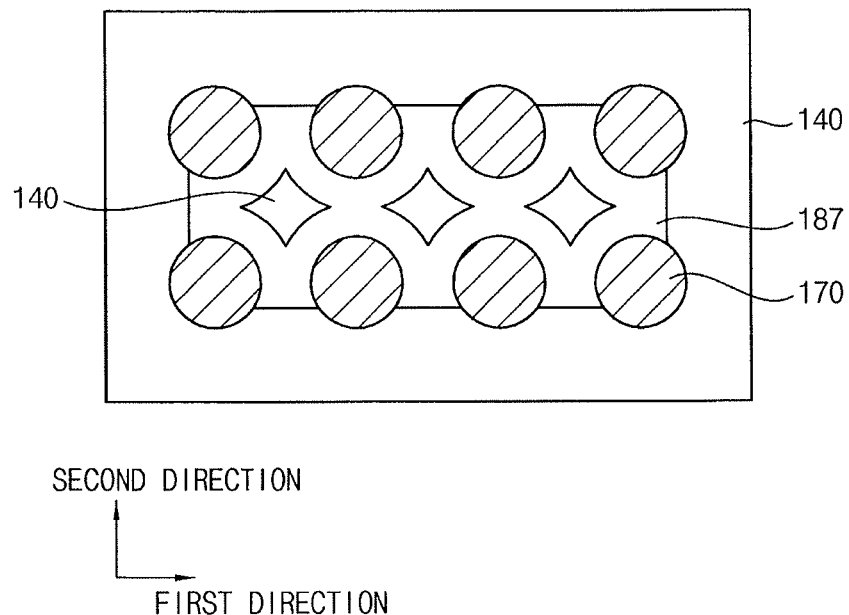
Figure 29C:
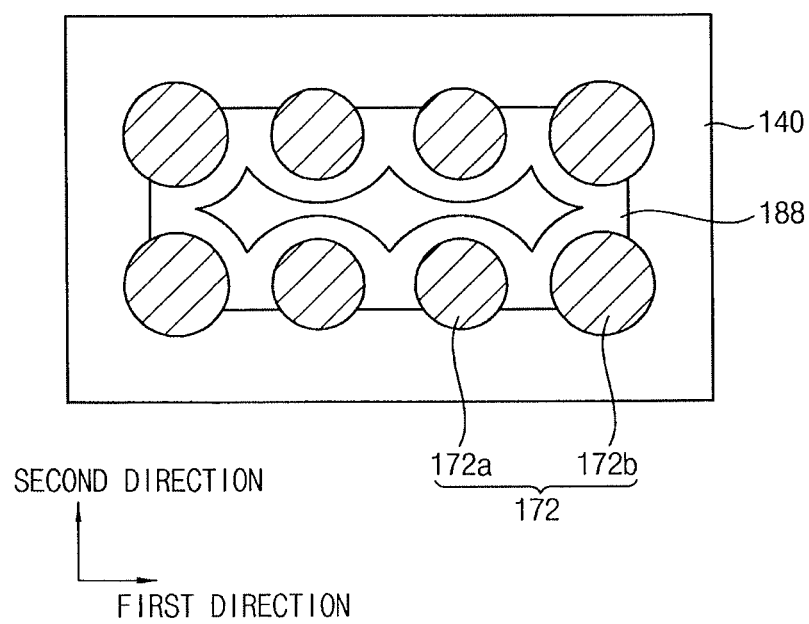

In one example embodiment, the lower electrodes 170 included in two lower electrode rows adjacent in the second direction may be entirely connected to one another by a supporting pattern 187, as illustrated in FIG. 29B.

In one example embodiment, the second lower electrodes 172b at both ends of the lower electrode row may have a width or a diameter larger than that of the first lower electrodes 172a between the second lower electrodes 172b. For example, a supporting pattern 188 may be formed on upper sidewalls of the lower electrodes 172 to connect the adjacent lower electrodes 172 such that a substantially rectangular array may be formed. The second lower electrodes 172b located at vertexes of the rectangular array may be connected to each other by the supporting pattern 188. The first lower electrodes 172a adjacent in the second direction may not be connected to each other by the supporting pattern 188.

Hereinafter, subsequent processes may be described with reference to the structure illustrated in FIG. 29A for ease of explanation.

Figure 30:
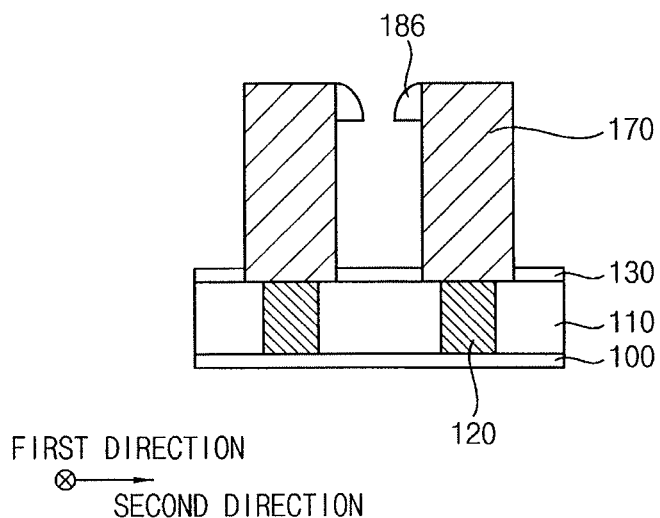
Figure 31:
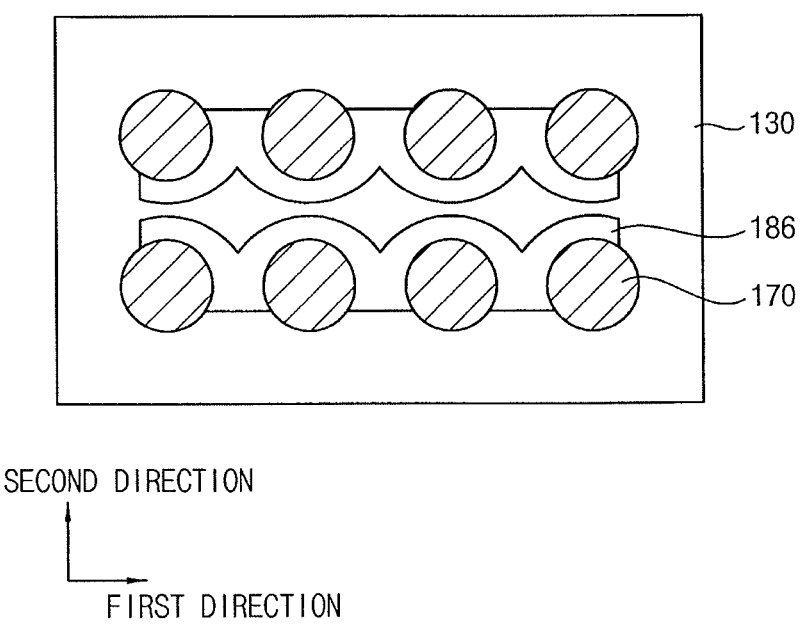

Referring to FIG. 30 and FIG. 31 that is a top plan view of FIG. 30, a process substantially the same as or similar to that illustrated with reference to FIG. 12 may be performed to remove the mold layer 140.

Figure 32:
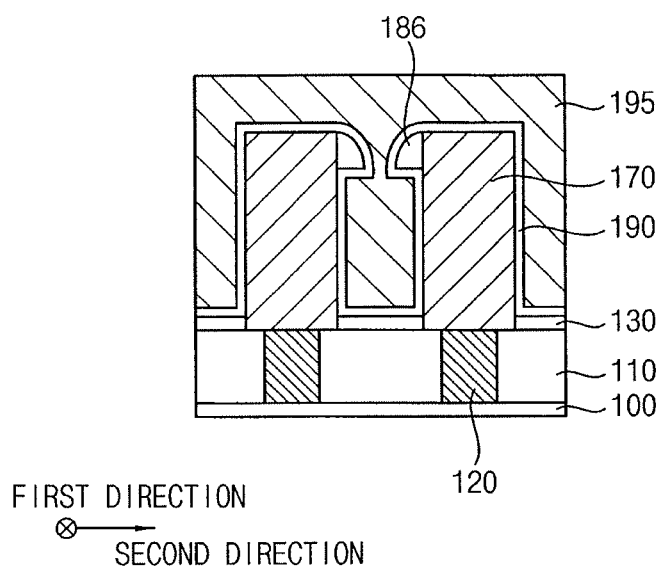

Referring to FIG. 32, a process substantially the same as or similar to that illustrated with reference to FIG. 13 may be performed. Accordingly, the dielectric layer 190 and the upper electrode 195 may be sequentially formed on the lower electrode 170, the supporting pattern 186 and the etch-stop layer 130. Thus, the capacitor structure according to example embodiments may be obtained.

FIGS. 33 to 36 are cross-sectional views illustrating a method of manufacturing a semiconductor device in accordance with example embodiments. For example, the semiconductor device may be a dynamic random access memory (DRAM) device.

Figure 33:
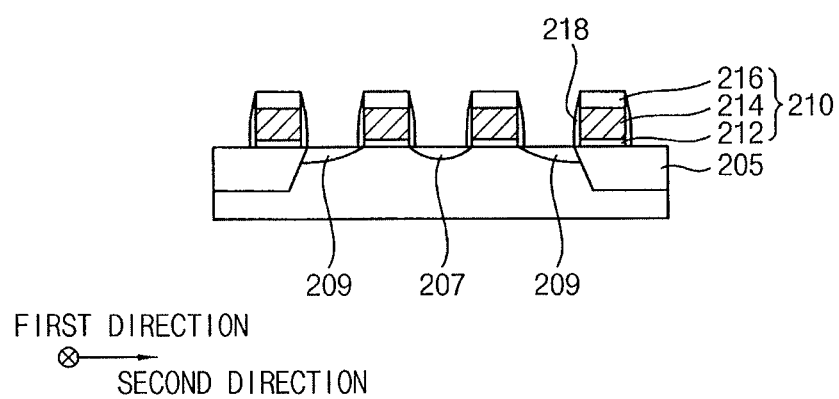
FIGS. 33 to 36 are cross-sectional views depicting stages in a method of manufacturing a semiconductor device in accordance with example embodiments.

Referring to FIG. 33, an isolation layer 205 may be formed on a substrate 200. The isolation layer 205 may be formed by, e.g., a shallow trench isolation (STI) process.

A gate insulation layer, a gate electrode layer, and a gate mask layer may be sequentially formed on the substrate 200. The gate insulation layer, the gate electrode layer, and the gate mask layer may be patterned by, e.g., a photolithography process to form a plurality of gate structures 210 on the substrate 200. Each gate structure 210 may include a gate insulation layer pattern 212, a gate electrode 214, and a gate mask 216 sequentially stacked on the substrate 200. The gate insulation layer may be formed using, e.g., silicon oxide or a metal oxide. The gate electrode layer may be formed using doped polysilicon, a metal, or a metal nitride. The gate mask layer may be formed using, e.g., silicon nitride.

Impurities may be implanted onto the substrate 200 using the gate structure 210 as an ion-implantation mask to form first and second impurity regions 207 and 209 at upper portions of the substrate 200 adjacent to the gate structures 210. Transistors may be defined by the gate structures 210 and the impurity regions 207 and 209. The first and second impurity regions 207 and 209 may serve as source/drain regions of the transistor.

A spacer 218 may be further formed on a sidewall of the gate structure 210. The spacer 218 may include, e.g., silicon nitride.

Figure 34:
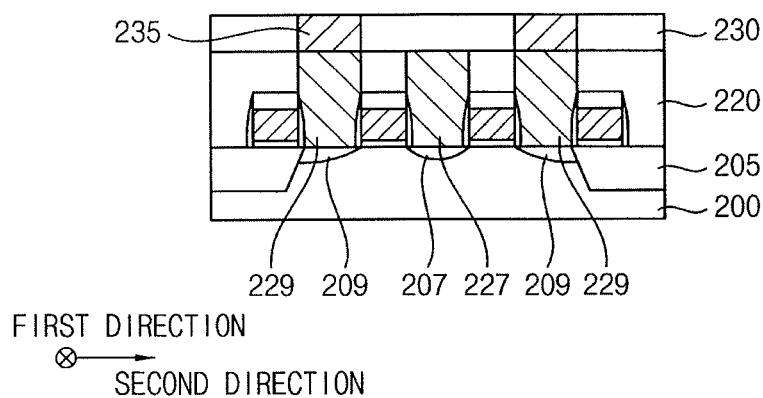

Referring to FIGS. 33 and 34, a first insulating interlayer 220 covering the gate structures 210 and the spacers 218 may be formed on the substrate 200. The first insulating interlayer 220 may be partially removed to form first holes (not illustrated) exposing the first and second impurity regions 207 and 209. In example embodiments, the first holes may be self-aligned with the gate structures 210 and the spacers 218.

A first conductive layer filling the first holes may be formed on the substrate 200 and the first insulating interlayer 220. An upper portion of the first conductive layer may be planarized by a CMP process and/or an etch-back process until a top surface of the first insulating interlayer 220 is exposed to form first and second plugs 227 and 229 in the first holes. The first and second plugs 227 and 229 may make contact with the first and second impurity regions 207 and 209, respectively. In example embodiments, a plurality of the second plugs 229 may be formed regularly in a first direction. The first conductive layer may be formed using doped polysilicon, a metal, etc. The first plug 227 may serve as a bit line contact.

A second conductive layer (not illustrated) contacting the first plug 227 may be formed on the first insulating interlayer 220 and the second conductive layer may be patterned to form a bit line (not illustrated). The second conductive layer may be formed using doped polysilicon, a metal, etc. A second insulating interlayer 230 may be formed on the first insulating interlayer 220 and the first and second plugs 227 and 229.

The second insulating interlayer 230 may be partially removed to form second holes (not illustrated) exposing top surfaces of the second plugs 229. A third conductive layer filling the second holes may be formed on the second plugs 229 and the second insulating interlayer 230. An upper portion of the third conductive layer may be planarized by a CMP process and/or an etch-back process until a top surface of the second insulating interlayer 230 is exposed to form third plugs 235 in the second holes. The third conductive layer may be formed using doped polysilicon, a metal, etc. The second and third plugs 229 and 235 may serve as capacitor contacts. According to another exemplary embodiment, the third plug 235 may be formed to directly contact the second impurity region 209 through the first and second insulating interlayers 220 and 230, without forming the second plug 229.

Figure 35:
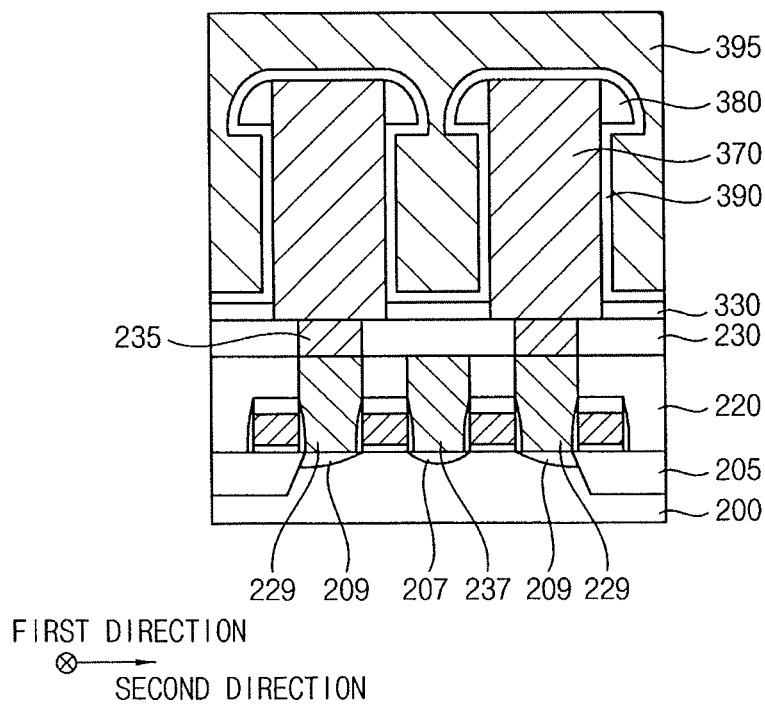

Referring to FIG. 35, processes substantially the same as or similar to those illustrated with reference to FIGS. 4 to 13 may be performed to form a capacitor structure on the second insulating interlayer 230 and the third plug 235. Accordingly, a plurality of lower electrodes 370 may be formed in the first direction to form a lower electrode row, and a plurality of the lower electrode rows may be formed in a second direction substantially perpendicular to the first direction. A supporting pattern 380 may enclose upper sidewalls of the lower electrodes 370 to connect the lower electrodes 370 to one another included in the lower electrode row. A dielectric layer 390 and an upper electrode 395 may be formed on the lower electrodes 370, the supporting pattern 380, and an etch-stop layer 330.

In some example embodiments, processes substantially the same as or similar to those illustrated with reference to FIGS. 14 to 21 may be performed, such that outermost lower electrodes of the lower electrode rows may be connected to each other in the second direction by a supporting pattern.

Figure 36:
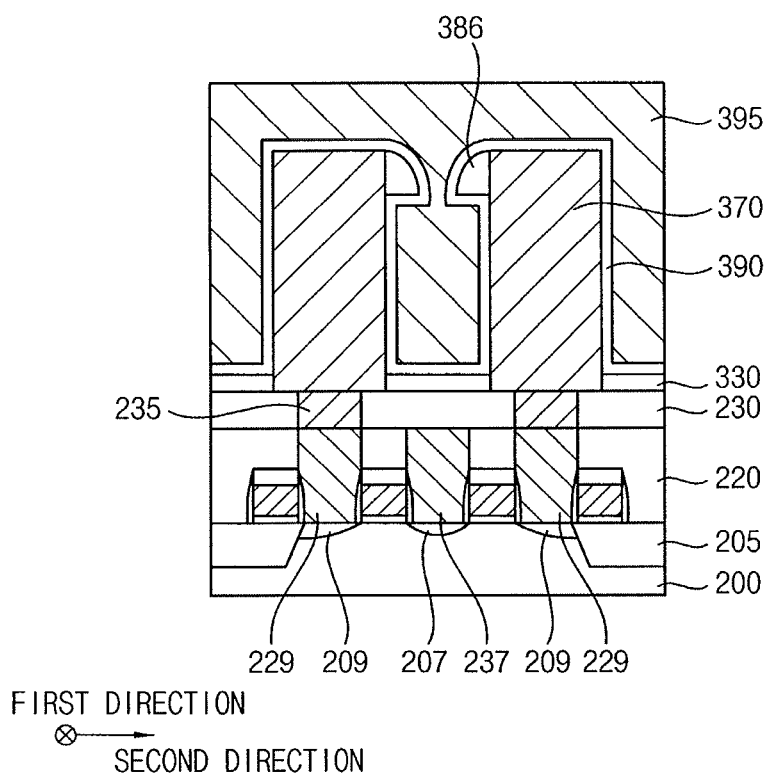

In some example embodiments, a supporting pattern 386 may be formed on only a portion of the upper sidewalls of the lower electrodes 370 as illustrated in FIG. 36. For example, processes substantially the same as or similar to those illustrated with reference to FIGS. 22 to 32 may be performed, such that the supporting pattern 386 may partially enclose the upper sidewalls of the lower electrodes 370 to connect the lower electrodes 370 included in the lower electrode row to one another along the first direction.

The semiconductor device according to example embodiments may be mounted or embedded in various types of a semiconductor package. The semiconductor device and the semiconductor package may be employed to various systems such as computing systems.

Figure 37:
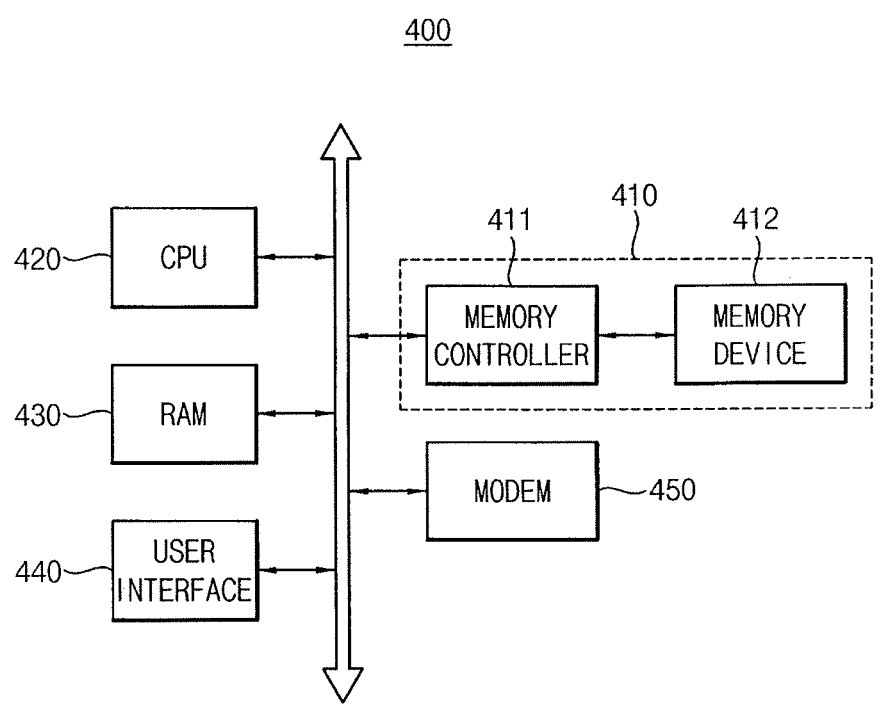
FIG. 37 is a block diagram illustrating a schematic construction of a computing system in accordance with example embodiments.

FIG. 37 is a block diagram illustrating a schematic construction of a computing system in accordance with example embodiments.

Referring to FIG. 37, a computing system 400 may include a microprocessor (CPU) 420 electrically connected to a system bus, a RAM 430, a user interface 440, a modem 450 such as a baseband chipset, and a memory system 410. The memory system 410 may include a memory device 412 and a memory controller 411. The memory controller 411 may be configured to control the memory device 412. The memory system 410 may serve as, e.g., a memory card or a solid state disk (SSD) by a combination of the memory device 412 and the memory controller 411. When the computing system 400 is utilized for a mobile device, a battery may be further provided to supply an operating voltage to the computing system 400. In some example embodiments, the computing system 400 may include an application chipset, a camera image processor, a mobile DRAM, or the like.

By way of summation and review, as semiconductor devices have become highly integrated, aspect ratios of capacitors included in the semiconductor devices have increased. However, due to, e.g., the increased aspect ratios, the lower electrodes of the capacitors may lean or collapse. To reduce the possibility of and/or prevent a capacitor, e.g., of a DRAM device, from leaning or bending, a method of forming a supporting pattern that supports a storage electrode of the capacitor has been developed.

For example, according to an exemplary method of forming a supporting pattern, a mold layer and a supporting layer including different materials from each other may be stacked, and then the supporting layer and the mold layer may be etched to form an opening in which the storage electrode is formed therein. However, the opening may not have a uniform profile because different layers are involved in the etching process. Thus, characteristics of the storage electrode may be deteriorated.

In contrast, embodiments relate to a method of forming a supporting pattern on a sidewall of the lower electrode that may reduce the possibility of and/or prevent the lower electrode from leaning or collapsing. Embodiments also relate to a capacitor structure that includes a pillar-shaped storage electrode and a supporting pattern and methods of forming the same. Embodiments also relate to a method of forming a capacitor structure having excellent structural stability and reliability, and to a capacitor structure having excellent structural stability and reliability.

According to example embodiments, an etching process or a patterning process for forming a supporting pattern may be performed after forming a lower electrode. Thus, a plurality of layers including different materials may not be etched in order to form the lower electrode or the supporting pattern.

Further, a structure or a shape of the supporting pattern may be properly controlled by adjusting configuration, arrangement and/or size of the lower electrodes.

For example, a plurality of the storage electrodes may be formed through a mold layer. The mold layer may be partially removed by an etch-back process to expose upper portions of the storage electrodes. A supporting layer covering the storage electrodes may be formed. The supporting layer may be anisotropically etched to form a supporting pattern having a substantially spacer shape on upper sidewalls of the storage electrodes. The supporting pattern may be formed after forming the storage electrode so that an etching process with respect to different layers may not be needed.

Example embodiments have been disclosed herein, and although specific terms are employed, they are used and are to be interpreted in a generic and descriptive sense only and not for purpose of limitation. Although a few example embodiments have been described, those skilled in the art will readily appreciate that many modifications are possible in the example embodiments without materially departing from the teachings. Accordingly, all such modifications are intended to be included within the scope of the present inventive concept as defined in the claims. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a capacitor structure, the method comprising:
    forming a mold layer on a substrate, the substrate including a plurality of plugs therein;
    partially removing the mold layer to form a plurality of openings, the plugs being exposed by the openings;
    forming a plurality of lower electrodes filling the openings, the lower electrodes having a solid pillar shape;
    removing an upper portion of the mold layer to expose upper portions of the lower electrodes;
    forming a supporting pattern selectively on exposed upper sidewalls of the lower electrodes and on the mold layer, after removing the upper portion of the mold layer;
    removing the mold layer; and
    sequentially forming a dielectric layer and an upper electrode on the lower electrodes and the supporting pattern.

2. The method as claimed in claim 1, wherein the mold layer is formed with silicon oxide or silicon and the supporting pattern is formed with silicon nitride.

3. The method as claimed in claim 1, wherein removing the upper portion of the mold layer includes performing an etch-back process.

4. The method as claimed in claim 1, wherein forming the supporting pattern includes:
    forming a supporting layer on the mold layer to cover the exposed upper sidewalls of the lower electrodes; and
    anisotropically etching the supporting layer.

5. The method as claimed in claim 4, wherein a thickness of the supporting pattern increases from a top portion of the supporting pattern to a bottom portion of the supporting pattern.

6. The method as claimed in claim 1, wherein:
    ones of the plurality of lower electrodes are arranged in a first direction to form one lower electrode row, and a plurality of lower electrode rows are arranged in a second direction perpendicular to the first direction, and
    the ones of the plurality of lower electrodes in the one lower electrode row are connected to each other by the supporting pattern.

7. The method as claimed in claim 6, wherein:
    another of the plurality of lower electrodes rows, which is adjacent to the one lower electrode row, includes others of the plurality of lower electrodes, and
    the ones of the plurality of lower electrodes and the others of the plurality of lower electrodes are connected to each other by the supporting pattern.

8. The method as claimed in claim 6, wherein:
    the plurality of lower electrodes includes first lower electrodes and second lower electrodes,
    the second lower electrodes of the one lower electrode row are at opposite ends of the one lower electrode row, and the first lower electrodes of the one lower electrode row are between the second lower electrodes of the one lower electrode row, and
    a width or a diameter of the second lower electrodes of the one lower electrode row is larger than that of the first lower electrodes of the one lower electrode row.

9. The method as claimed in claim 8, wherein:
    the second lower electrodes in the one lower electrode row and second lower electrodes in an adjacent one of the plurality of lower electrode rows in the second direction, are connected to each other by the supporting pattern, and
    the first lower electrodes in the one lower electrode row and first lower electrodes in the adjacent one of the plurality of lower electrode rows in the second direction, are not connected to each other by the supporting pattern.

10. The method as claimed in claim 6, further comprising forming a mask partially covering the mold layer and the plurality of lower electrode rows, after forming the plurality of the lower electrodes.

11. The method as claimed in claim 10, wherein the mask covers a part of the lower electrodes in the plurality of lower electrode rows such that the exposed upper sidewalls of the lower electrodes on which the supporting pattern is formed are exposed by the mask.

12. The method as claimed in claim 11, wherein the lower electrodes included in two adjacent lower electrode rows of the plurality of lower electrode rows are connected to each other by the supporting pattern to form a rectangular array.

13. A method of forming a capacitor structure, the method comprising:
    forming openings in a mold layer on a substrate, the openings exposing plugs in the substrate;
    forming a plurality of lower electrodes having a solid pillar shape to fill the openings in the mold layer;
    removing an upper portion of the mold layer such that a lower portion of the mold layer remains on the substrate;
    forming a supporting pattern selectively on the lower portion of the mold layer, after removing the upper portion of the mold layer;
    removing the lower portion of the mold layer to form voids under the supporting pattern; and
    forming a dielectric layer and an upper electrode in the voids.

14. The method as claimed in claim 13, wherein:

the supporting pattern is formed as a continuous layer that encloses at least two of the plurality of lower electrodes, and the dielectric layer and the upper electrode are sequentially formed both to fill the voids and to cover the lower electrodes and the supporting pattern.

15. The method as claimed in claim 13, wherein:

removing the upper portion of the mold layer exposes upper parts of the lower electrodes while lower parts of the lower electrodes remain covered by the lower portion of the mold layer, and forming the supporting pattern includes covering the upper parts of the lower electrodes and covering exposed regions of the lower portion of the mold layer with a supporting pattern layer.

16. The method as claimed in claim 15, wherein:

the exposed regions of the lower portion of the mold layer are formed by removing the upper portion of the mold layer before the supporting pattern layer is formed, and the supporting pattern layer is etched to form the supporting pattern before the dielectric layer and the upper electrode are formed.

17. The method as claimed in claim 16, wherein the supporting pattern layer is etched such that the supporting pattern is formed as a continuous layer that encloses sidewalls of the upper parts of at least two of the lower electrodes.

* * * * *